United States Patent
Uchida

(10) Patent No.: US 7,193,339 B2
(45) Date of Patent: Mar. 20, 2007

(54) POSITIONING APPARATUS AND CHARGED-PARTICLE-BEAM EXPOSURE APPARATUS

(75) Inventor: Shinji Uchida, Tochigi (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/693,104

(22) Filed: Oct. 27, 2003

(65) Prior Publication Data

US 2004/0090129 A1   May 13, 2004

(30) Foreign Application Priority Data

Oct. 31, 2002 (JP) ............................. 2002-318486

(51) Int. Cl.
*H02K 41/00* (2006.01)
(52) U.S. Cl. ........................................................ 310/12
(58) Field of Classification Search ............ 310/12–39
See application file for complete search history.

(56) References Cited

U.S. PATENT DOCUMENTS

| | | | | |
|---|---|---|---|---|
| 4,255,680 A | * | 3/1981 | Popov et al. .................. 310/13 |
| 4,774,428 A | * | 9/1988 | Konecny ..................... 310/198 |
| 4,868,431 A | * | 9/1989 | Karita et al. .................. 310/12 |
| 4,945,268 A | * | 7/1990 | Nihei et al. ................... 310/12 |
| 5,294,854 A | * | 3/1994 | Trumper .................... 310/90.5 |
| 6,069,417 A | * | 5/2000 | Yuan et al. ................... 310/12 |
| 6,382,935 B1 | * | 5/2002 | Mikiya et al. ........... 417/413.1 |
| 6,548,920 B2 | * | 4/2003 | Joong et al. .................. 310/12 |
| 6,720,681 B2 | * | 4/2004 | Hsiao .......................... 310/12 |
| 6,787,945 B2 | * | 9/2004 | Miyata ....................... 310/12 |
| 2002/0117903 A1 | | 8/2002 | Uchida ........................ 310/12 |

FOREIGN PATENT DOCUMENTS

JP          11-194824          7/1999

* cited by examiner

*Primary Examiner*—Dang Le
(74) *Attorney, Agent, or Firm*—Fitzpatrick, Cella, Harper & Scinto

(57) ABSTRACT

A positioning apparatus includes a movable member for transmitting a driving force in a driving-axis direction to a stage, a first electromagnet for driving the movable member in the driving-axis direction by forming a magnetic path between the movable member and the first electromagnet and generating first magnetic flux, and a second electromagnet, which is positioned away from the first electromagnet and arranged in an overlapping direction, for driving the movable member in the same direction as the driving-axis direction of the first electromagnet by forming a magnetic path between the movable member and the second electromagnet and generating second magnetic flux having an inverted plurality from the first magnetic flux.

7 Claims, 20 Drawing Sheets

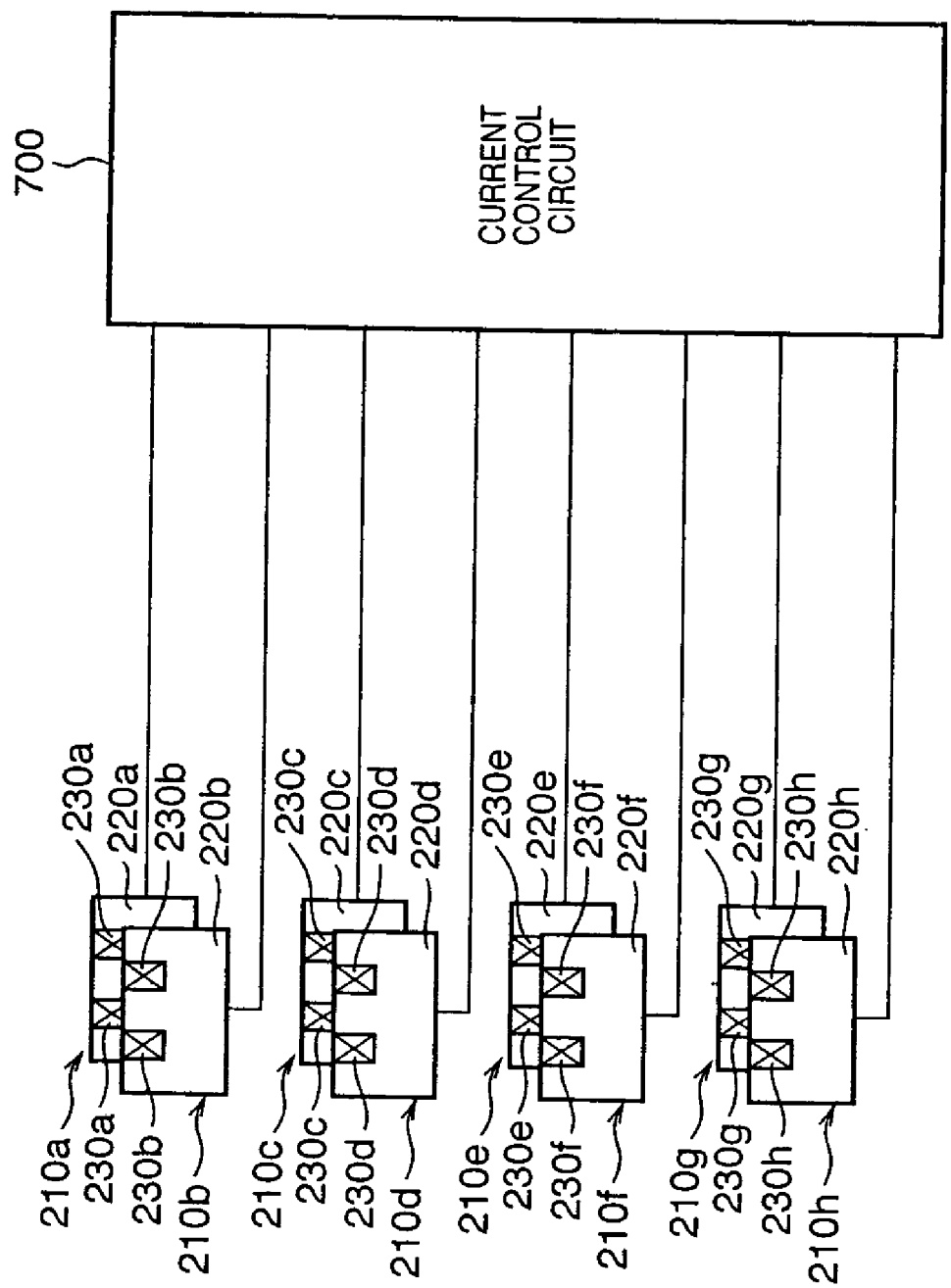

DISTRIBUTION OF MAGNETIC FLUX DENSITY By IN NEIGHBORHOOD OF SUBSTRATE
(ABSOLUTE VALUE INDICATION)

DISTRIBUTION OF MAGNETIC FLUX DENSITY By IN NEIGHBORHOOD OF SUBSTRATE
(ABSOLUTE VALUE INDICATION)

SEMICONDUCTOR DEVICE MANUFACTURING FLOW

POSITIONING APPARATUS AND CHARGED-PARTICLE-BEAM EXPOSURE APPARATUS

FIELD OF THE INVENTION

The present invention relates to a positioning technique, and more particularly, to a positioning technique that can be applied to a semiconductor manufacturing apparatus, such as a charged-particle-beam exposure apparatus, which performs pattern drawing using a charged-particle beam.

BACKGROUND OF THE INVENTION

In a semiconductor manufacturing process, lithography is employed as a technique of drawing patterns on a wafer. In lithography, various patterns formed on a mask are demagnified and transferred to a wafer using light beams. The mask patterns used in the lithography require extraordinary precision. A charged-particle-beam exposure apparatus is employed to form such mask patterns. A charged-particle-beam exposure apparatus is also used for directly drawing patterns on a wafer without using a mask.

Charged-particle-beam exposure apparatuses include a point-beam type, which irradiates a spot-like beam, and a variable-rectangular-beam types which irradiates a beam having a variable rectangular cross section. Regardless of the configuration, the charged-particle-beam exposure apparatus generally comprises an electron gun unit for generating a charged-particle beam, an electron optical system for introducing the beam generated by the electron gun to a sample, a stage system for scanning the entire surface of the sample relative to the electron beam, and an objective deflector for positioning the electron beam on the sample surface with high precision.

A charged-particle beam has an extraordinarily high response. Therefore, rather than improving the mechanical and regulatory characteristics of the stage, it is a general procedure to adopt a system that measures an error in the posture and position of the stage and feedbacks the error to positioning of the beam by a deflector which causes a charged-particle beam to scan.

The stage is provided in a vacuum chamber and constrained not to cause magnetic field fluctuation that influences the positioning of a charged-particle beam. For this reason, conventionally, all that is required is for the stage to move in a two-dimensional direction. The stage is configured with limited contact-type components, e.g., a rolling guide, a ball screw actuators or the like. Therefore, the conventional contact-type components raise problems of lubrication and dust generation. To cope with these problems, the conventional art has proposed a construction shown in FIG. 1, which employs electromagnets (1, 2) as a driving element of the XY stage. Japanese Patent Application Laid-Open No. 11-194824 discloses a non-contact six-degree-of-freedom stage mechanism which employs electromagnet actuators and magnetic shields. The method disclosed in this document allows less fluctuation of leakage flux and assures a highly immaculate environment. Therefore, it is applicable to a positioning apparatus in a vacuum environment and enables highly precise positioning operation.

Higher precision in exposure operation and higher speed in stage driving are further demanded to improve a throughput of the exposure apparatus. However, to meet such demands, the non-contact six-degree-of-freedom stage mechanism employing electromagnet actuators and magnetic shields, which is disclosed in the aforementioned document, raises a problem of a complicated structure of the magnetic shield portion. In other words, due to the massive structure of the magnetic shield portion, the weight of the movable portion of the stage increases. Therefore, it has conventionally been difficult to achieve high acceleration/deceleration of the stage and high-speed positioning at the cost of the servo rigidity of the driving system which includes the above-described components.

SUMMARY OF THE INVENTION

The present invention has been proposed in view of the conventional problems, and has as its object to provide a positioning apparatus comprising a mechanism for reducing generation of leakage flux. Such a positioning apparatus is realized by simplifying the magnetic shield mechanism. As a result, it is possible to realize weight reduction of a precision-motion substrate stage, high acceleration/deceleration of the stage, which mounts the precision-motion substrate stage, and high-speed positioning control.

To solve the above problem, a positioning apparatus according to the present invention mainly has a movable member for transmitting a driving force in a driving-axis direction to a stage, a first electromagnet for driving the movable member in the driving-axis direction by forming a magnetic path between the movable member and the first electromagnet and generating first magnetic flux, and a second electromagnet, which is positioned away from the first electromagnet and arranged in an overlapping direction, for driving the movable member in the driving-axis direction by forming a magnetic path between the movable member and the second electromagnet and generating second magnetic flux having an inverted polarity from the first magnetic flux.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

The accompanying drawings, which are incorporated in and constitute a part of the specification, illustrate embodiments of the invention and, together with the description, serve to explain the principles of the invention.

FIG. 2B is an explanatory view of a current control circuit which controls magnetic flux of electromagnets;

DETAILED DESCRIPTION OF THE PREFERRED EMBODIMENTS

Preferred embodiments of the present invention will now be described in detail in accordance with the accompanying drawings.

First Embodiment

A one-axis electromagnet stage according to the first embodiment is now described with reference to FIGS. 2A to 4.

Figure 1:
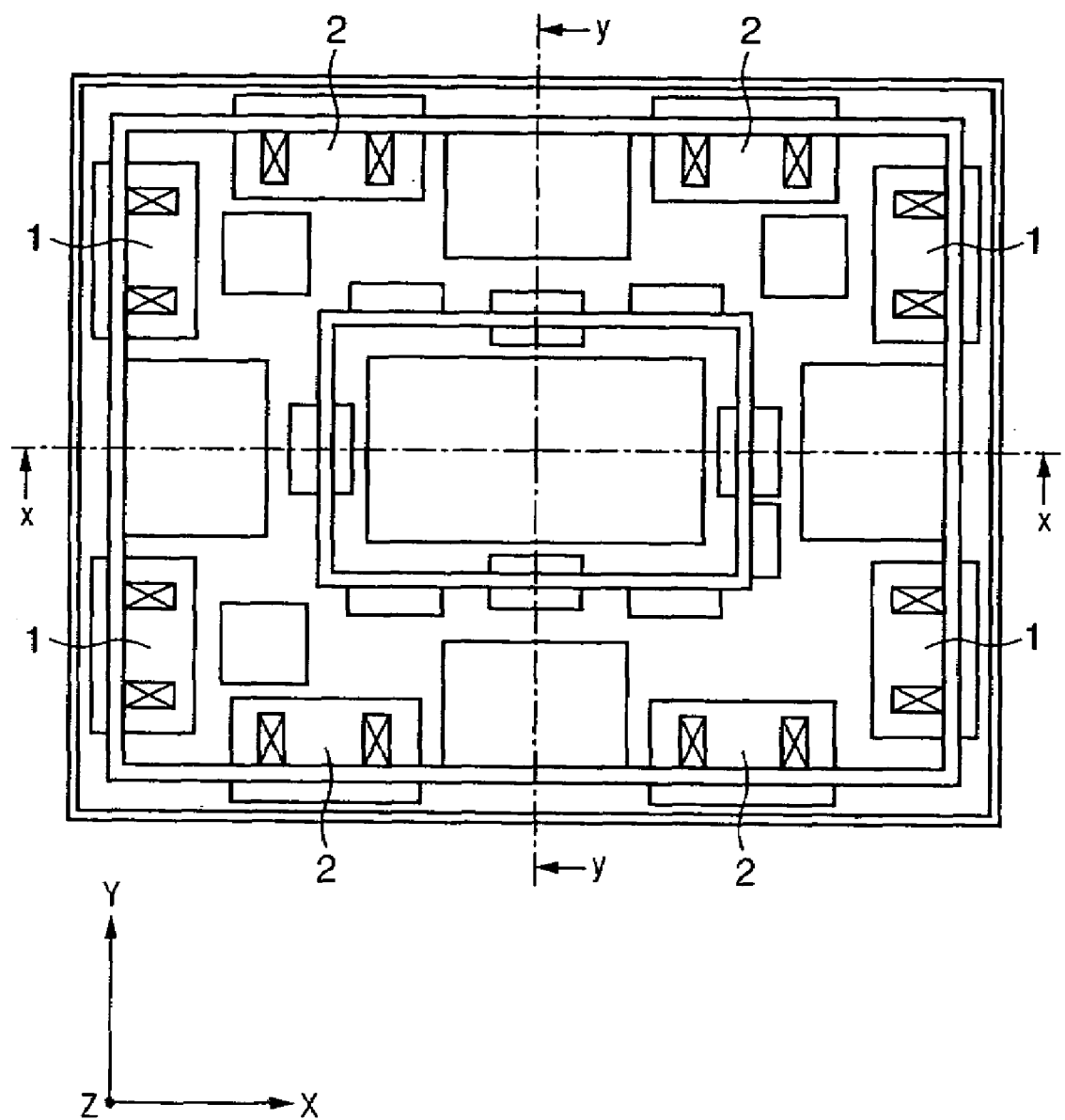
FIG. 1 is a diagram illustrating a construction of a conventional driving mechanism.
Figure 2A:
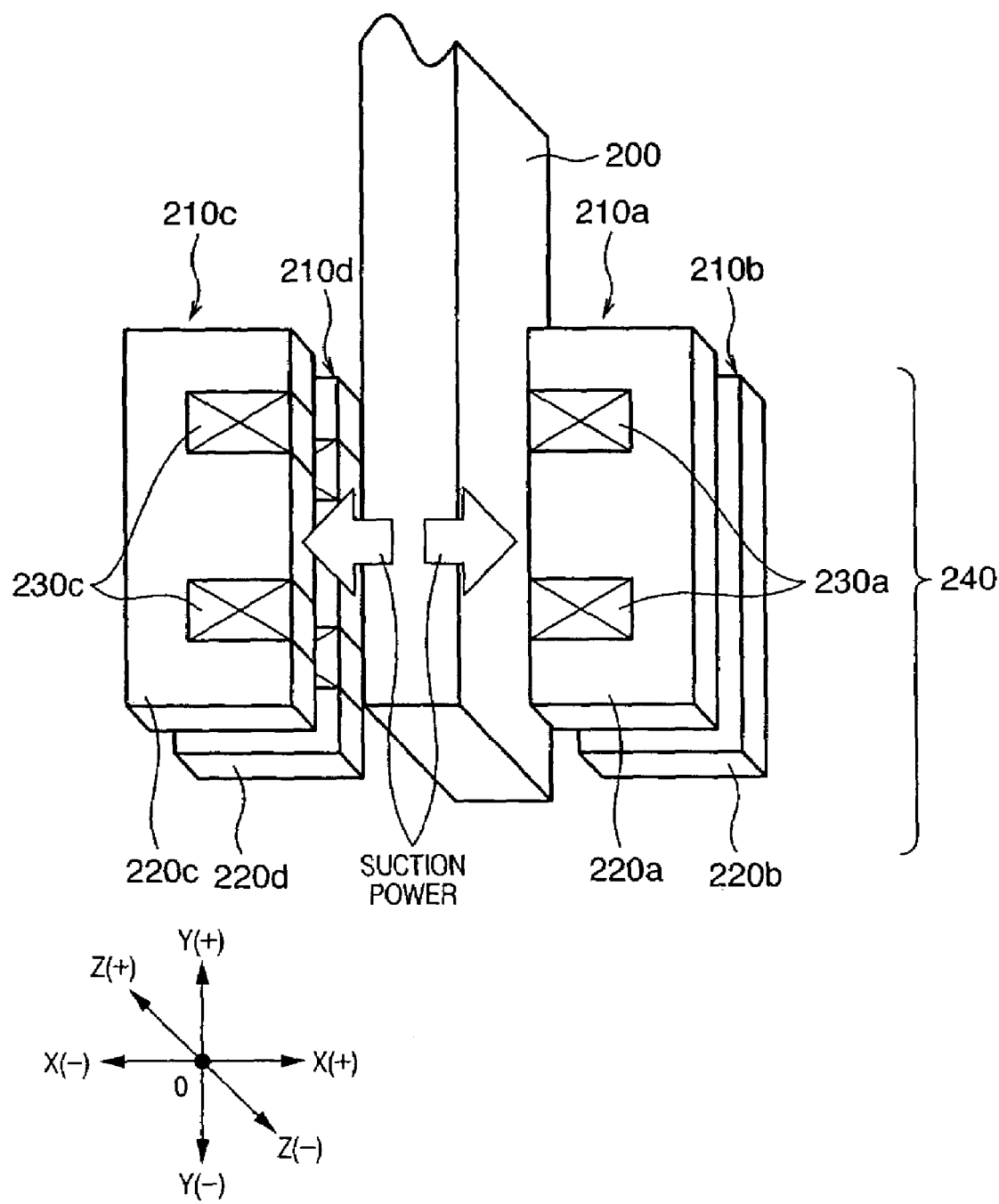
FIG. 2A is a diagram illustrating a construction of a one-axis driving mechanism having an electromagnet unit as a driving source.

FIG. 2A shows a construction of a one-axis driving mechanism having an electromagnet unit as a driving source. The one-axis driving mechanism shown in FIG. 2A is configured with an I core 200, which is a movable member, and electromagnets 210a, 210b, 210c and 210d. Two of the electromagnets are arranged in each side of the I core in a way to sandwich the I core while maintaining a predetermined gap. The electromagnets 210a, 210b, 210c and 210d are constructed with E cores 220a, 220b, 220c and 220d as well as excitation coils 230a, and so on, which are wound around the E cores. The four electromagnets 210a, 210b, 210c and 210d are arranged as a stationary member 240 relative to the I core 200, and are integrally connected so as riot to make relative movement.

When the I core 200 is driven in the X direction, electric currents of inverse directions are applied respectively to the excitation coil 230a wound around the E core 220a of the electromagnet 210a and the excitation coil 230b (FIG. 2B) wound around the E core 220b of the electromagnet 210b to pull the I core 200 in one direction. As a result, the coils 230a and 230b are excited (see FIGS. 3A and 3B).

In order to simultaneously apply the currents of inverse directions having the same amount to the excitation coils 230a and 230b, the excitation coils 230a and 230b are respectively wound around the E cores 220a and 220b in the directions opposite to each other. Alternatively, the coils may be wound around the E cores in the same direction, but the polarity of the electric currents applied to the excitation coils may be inverted by controlling of a current control circuit.

FIG. 2B shows a current control circuit 700 which switches the polarity of a current and plural combinations of electromagnets 210a to 210h connected to the circuit 700. The current control circuit 700 controls the polarity of current and the amount of current for driving the I core 200 in a predetermined direction of the driving axis, thereby causing respective electromagnets to generate suction power. The magnetic flux generated by the electromagnets is controlled in accordance with the winding direction of the excitation coils and controlling of the current control circuit (with respect to the polarity and the amount of current).

When a magnetic field is formed in the magnetic path from the E cores (220a to 220h) to the I core 200, suction power is generated between the E cores (220a to 220h) and the I core 200 due to the magnetic action. FIG. 2A shows a state in which the suction power, which is caused by the magnetic action of the electromagnets 210, acts upon the I core 200 and the I core is balanced within the gap. In accordance with the level of suction power, the I core 200 can translationally be driven in the X(+) direction or X(−) direction.

Figure 3A:
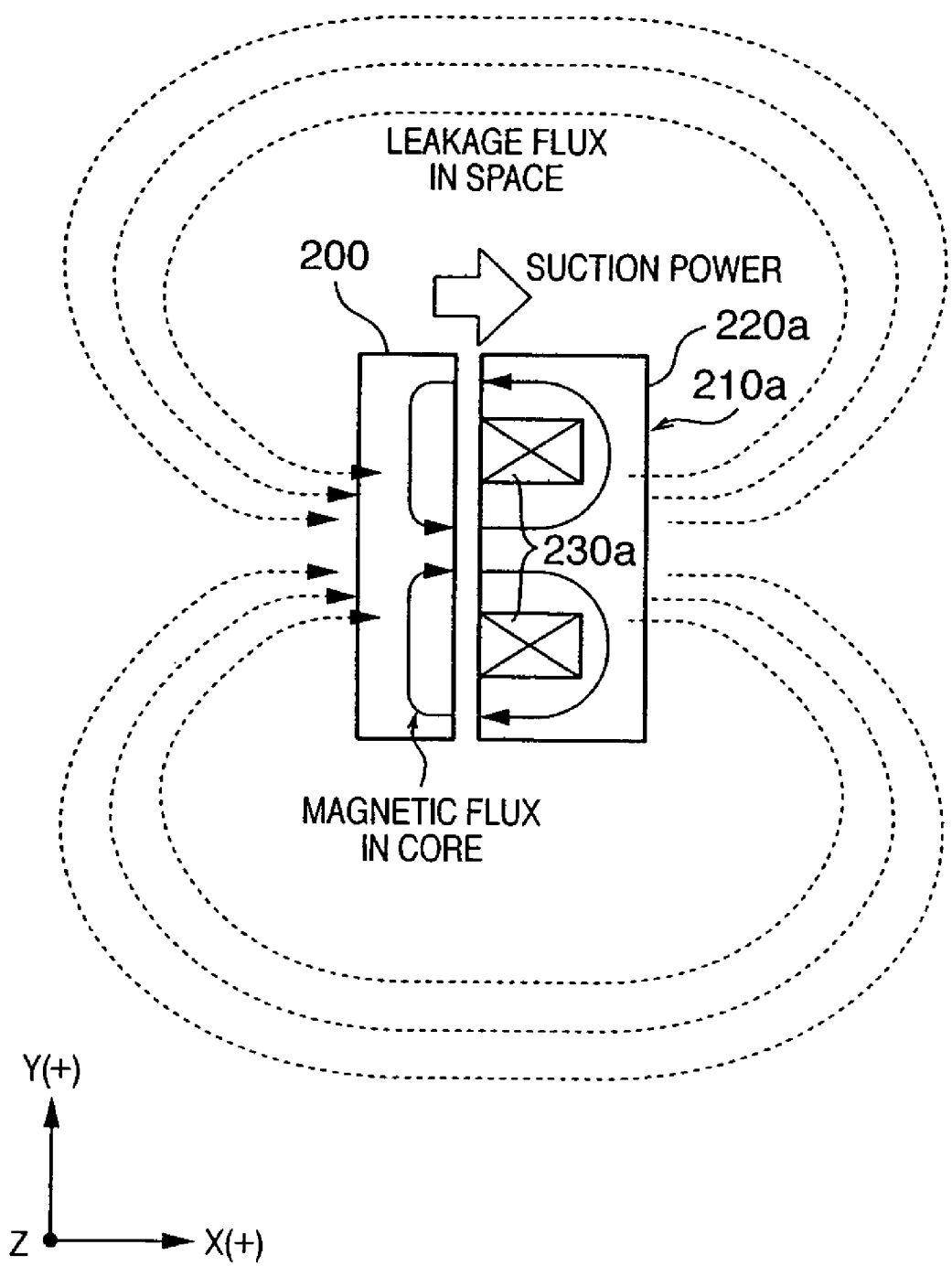
FIGS. 3A and 3B are explanatory views of a magnetic flux distribution of electromagnets.
Figure 3B:
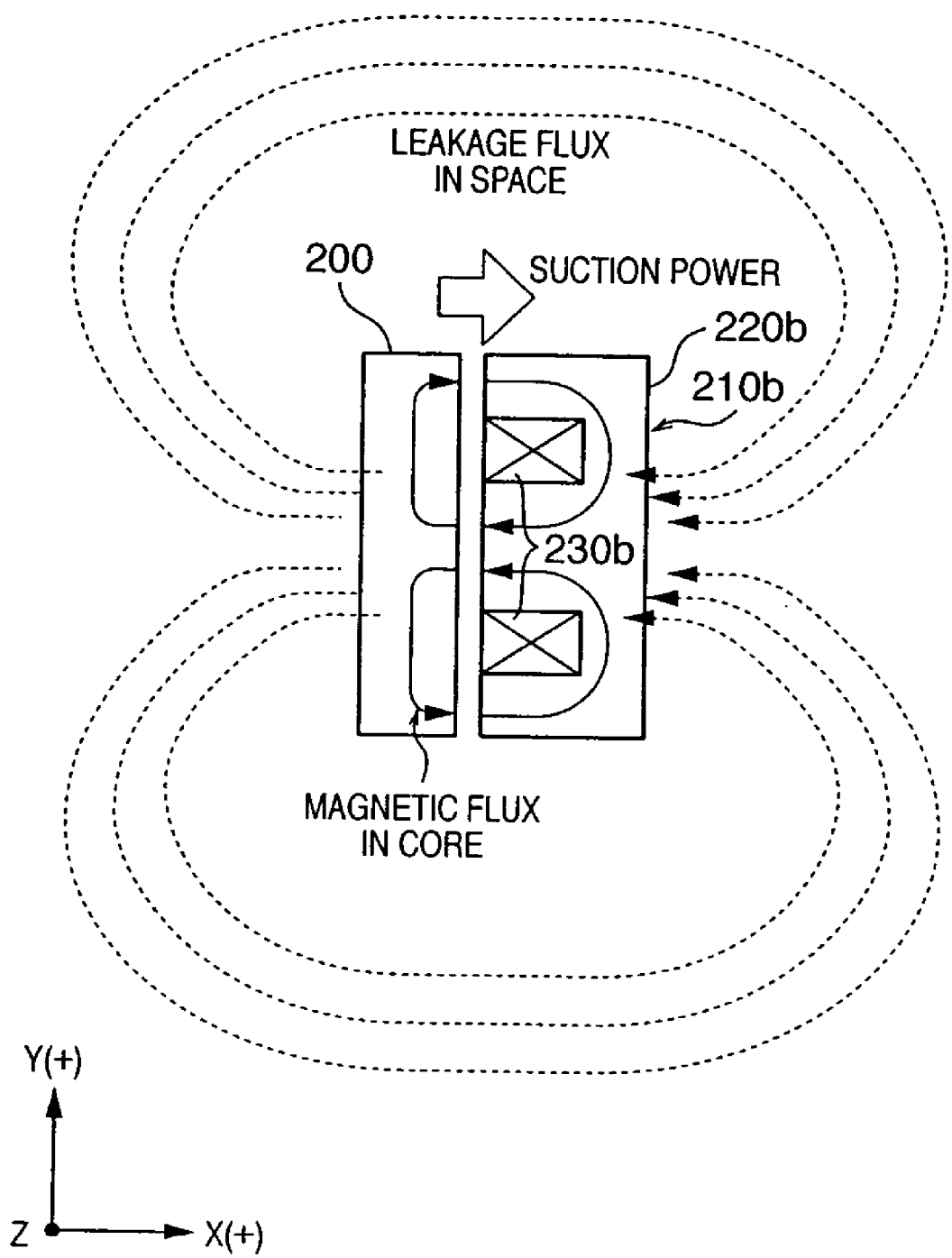
Figure 3C:
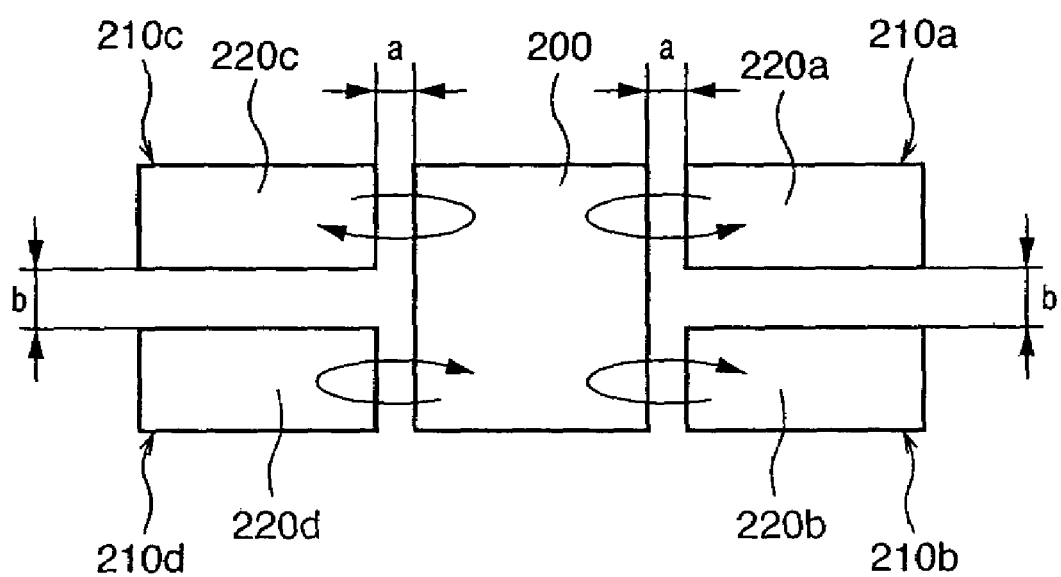
FIG. 3C is an explanatory view describing a positional relation of electromagnets and an I core.
Figure 3C:
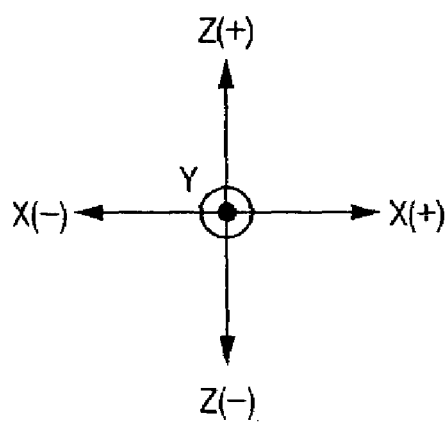

Next, a distribution of magnetic flux and magnetic field formed around the electromagnet 210a is described with reference to FIGS. 3A to 3C. FIGS. 3A and 3B are schematic views showing a state of magnetic field in a case where the I core 200 is pulled in the X-axis plus direction (X(+) direction). The electromagnets 210a and 210b arranged on the X(+) side of the I core 200 form a magnetic path in the E cores (220a, 220b) and I core 200 as indicated by the arrows with solid lines and generate magnetic flux. In this stage, currents of inverse directions having the same amount are applied to the respective excitation coils 230a and 230b of the electromagnets 210a and 210b.

Among the two electromagnets 210a and 210b in the X(+) direction, FIG. 3A shows the magnetic flux generated by the electromagnet 210a arranged in the Z-axis plus direction (Z(+) direction) and FIG. 3B shows the magnetic flux generated by the electromagnet 210b arranged in the Z-axis minus direction (Z(−) direction). The magnetic path is formed from the E cores 220 of the respective electromagnets to the I core 200 through the gap as indicated by the arrows with solid lines. Since currents of inverse directions flow through the excitation coils (230a, 230b) of the electromagnets 210a and 210b, the magnetic flux flowing through the respective magnetic paths has inverse directions. Suction power according to the magnetic flux formed in each magnetic path is generated between the I core 200 and electromagnet 210.

In the external space of the E cores 220a, 220b and I core 200, leakage flux is generated in the direction indicated by the arrows with dashed lines. The magnetic fields shown in FIGS. 3A and 3B have inverse directions. The leakage flux generated in the external space of the respective electromagnets has inverse polarities and substantially an equal intensity. Since the electromagnets 210a and 210b are arranged in parallel in the same direction (so as to overlap in the Z direction), the magnetic fields having inverse polarities cancel each other, thus suppressing generation of leakage flux around the electromagnets 210a and 210b.

By employing the electromagnets utilizing the effect of magnetic field cancellation as a driving propulsion source of a one-axis direction, it is possible to construct a one-axis electromagnet stage which can reduce the leakage flux around the electromagnets. Note that a specific example of the effect of magnetic field cancellation will be described in the fourth embodiment, so a description thereof is omitted.

The positional relation between the electromagnets (210a to 210d) and I core 200 shown in FIG. 2A is described with reference to FIG. 3C. It is preferable to set the gap (a in FIG. 3C) between the end surface of the electromagnets (210a to 210d) and the end surface of the I core 200 to 2 or 3 mm or less. However, the purpose of the present invention is not limited to this value. It is acceptable as long as the value a is set sufficiently smaller than the distance (b in FIG. 3C) between the two electromagnets (210a and 210b, 210c and 210d in FIG. 3C) arranged in parallel (overlapped in the Z direction).

The value is so set as a result of consideration of the balance between the intensity of the magnetic flux generated between the respective E cores (220a and 220b, 220c and 220d) constituting the electromagnets (210a, 210b, 210c and 210d) and the intensity of the magnetic flux generated between the electromagnets (210a to 210d) and the I core 200. In order to generate sufficient suction power, the gap a must be sufficiently smaller than the distance b between the electromagnets.

Taking the magnetic path between the E cores 220a and 220b of the electromagnets 210a and 210b arranged in the Z direction and the magnetic path of the E cores (220a, 220B) and the I core 200 satisfying the above-described condition for an example, the magnetic flux generated in the magnetic path of the E cores (220a, 220b) and the I core 200 becomes dominant. Therefore, the influence of the magnetic path between the E cores 220a and 220b becomes extremely small.

(Construction of Movable Member)

Figure 4:
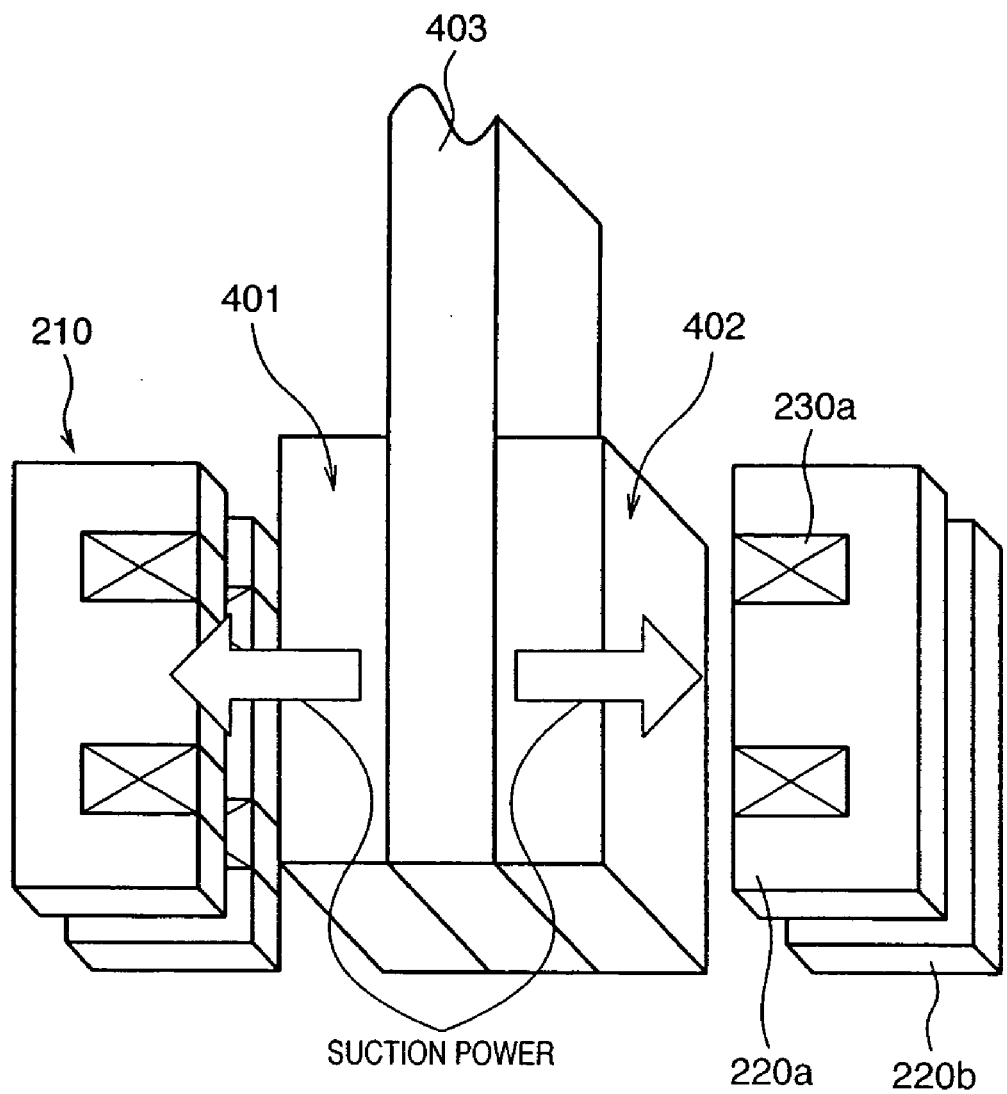
FIG. 4 is a diagram illustrating a modification of an I core.

In the above-described construction shown in FIG. 2A, the I core 200 pulled by the two electromagnets arranged in the X-axis minus direction (X(−) direction) and the two electromagnets arranged in the X-axis plus direction (X(+) direction) is constructed with a single common member. However, the I core 200 serving as a movable member does not always have to be a common member. For instance, as shown in FIG. 4, an I core 401 pulled in the X(−) direction and an I core 402 pulled in the X(+) direction may be provided, and they may be integrally connected by an I core supporting member 403 50 that the two I cores do not have relative movement. The I core supporting member 403 may be formed with a magnetic material (e.g., a multi-layer steel plate) or a nonmagnetic material. Adopting a lightweight material as the supporting member 403 enables a reduction in weight of the entire movable members (401, 402, 403), thus achieving an advantageous construction for high acceleration/deceleration of the stage and high-speed positioning.

Second Embodiment

A construction of a two-axis electromagnet stage according to the second embodiment is now described with reference to FIG. 5.

Define that the pairs of electromagnets arranged on both sides of the I core (total of four electromagnets) are one electromagnet unit. Combining a plurality of electromagnet units as a multiple-degree-of-freedom driving source can construct a multi-axis electromagnet stage capable of reducing leakage flux around the electromagnets.

Figure 5:
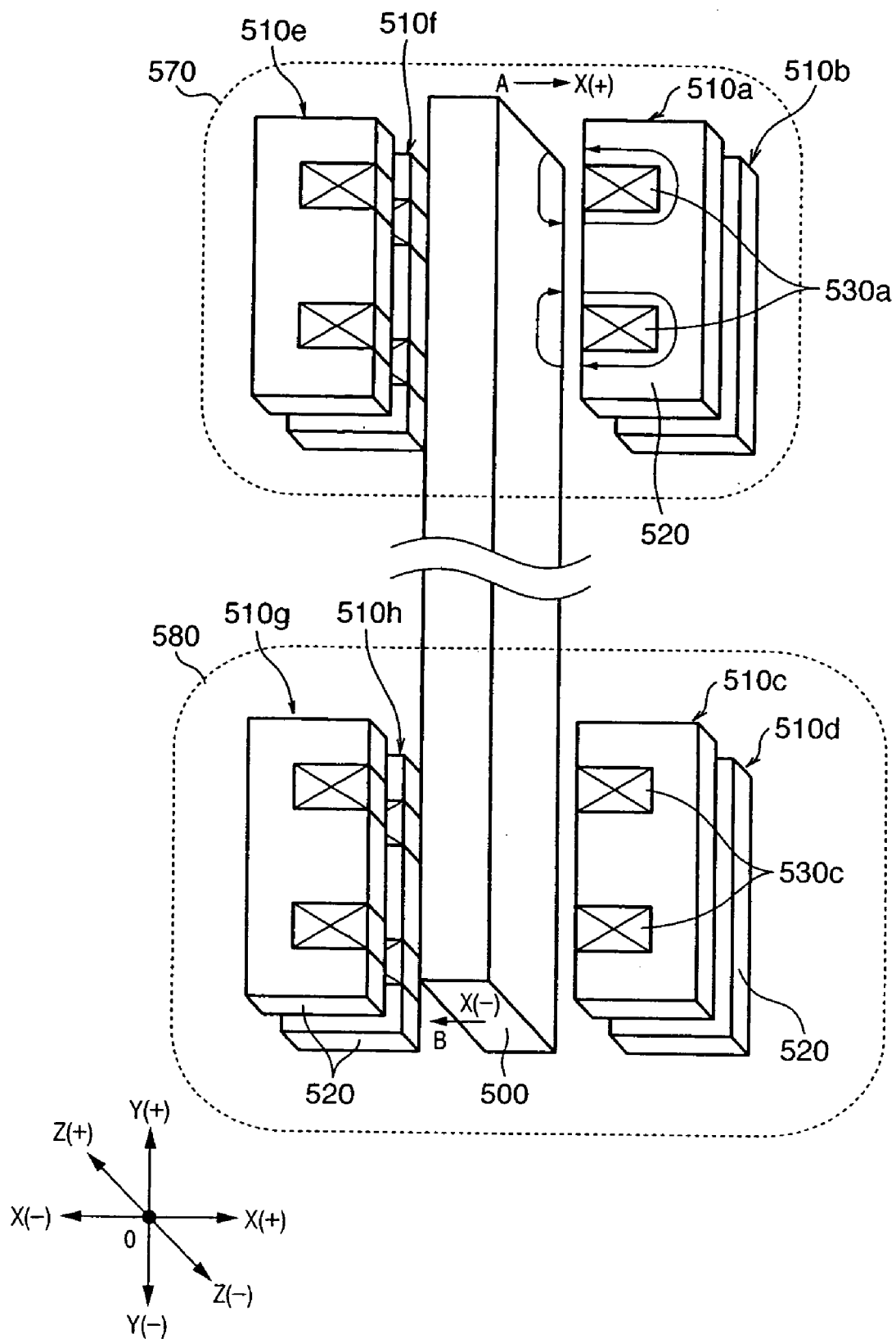
FIG. 5 is a diagram illustrating a construction of a two-axis driving mechanism having an electromagnet unit as a driving source.

FIG. 5 shows a construction using two sets of electromagnet units 570 and 580, which function as a two-axis driving source for translationally driving an I core in the X-axis direction and rotationally driving the I core around the Z axis. Electromagnets 510a to 510h can generate predetermined suction power to drive the I core 500 in the translational direction (e.g., (X(+/−) direction). The two sets of electromagnet units 570 and 580 are arranged away from each other in the Y-axis direction. For instance, when the electromagnet unit 570 pulls the A-end of the I core 500 in the X(+) direction and the electromagnet unit 580 pulls the B-end of the I core 500 in the X(−) direction, it is possible to rotate the I core 500 around the Z axis.

To translationally drive the entire I core 500 in the X(+) direction, a predetermined current is applied to excitation coils 530a and 530c of the electromagnets 510a and 510c as well as excitation coils of the electromagnets 510b and 510d so that suction power in the X(+) direction is generated by the electromagnets 510a to 510d arranged on the X(+) side. In the similar manner, to translationally drive the I core 500 in the X(−) direction, suction power in the X(−) direction is generated on the electromagnets 510e to 510h. To rotationally drive the I core, one end of the I core 500 is pulled in the X(+) direction and the other end of the I core 500 is pulled in the X(−) direction.

The suction power generated by the electromagnets 510a to 510h is realized by a similar mechanism to that of the first embodiment described with reference to FIGS. 3A to 3C, so a detailed description thereof is omitted. For instance as shown on the electromagnet 510a, a magnetic path is formed between the E core 520 and I core 500 as indicated by the arrows with the solid lines. Suction power according to the magnetic flux formed in each magnetic path is generated between the I core 500 and electromagnet 510a.

In this stage, currents of inverse directions having the same amount are applied respectively to the excitation coil 530a wound around the electromagnet 510a and the excitation coil 530b wound around the electromagnet 510b. As mentioned in the first embodiment, the application of currents in inverse directions may be substituted with inverse winding of the coils or inverse polarities of the currents using the current control circuit.

Taking the electromagnet 510a generating the suction power as an example, leakage flux such as that shown in FIG. 3A is generated in the external space of the B core 520 and I core 500. However, the leakage flux can be cancelled by the electromagnet 510b arranged in the overlapping direction because the electromagnet 510b forms leakage flux of an inverse polarity and substantially an equal intensity to that of the electromagnet 510a (see FIG. 3B). Accordingly, by employing the electromagnet units utilizing the effect of magnetic field cancellation as a driving propulsion source of a two-axis direction, it is possible to construct a two-axis electromagnet stage which can reduce the leakage flux around the electromagnets.

Third Embodiment

Figure 6:
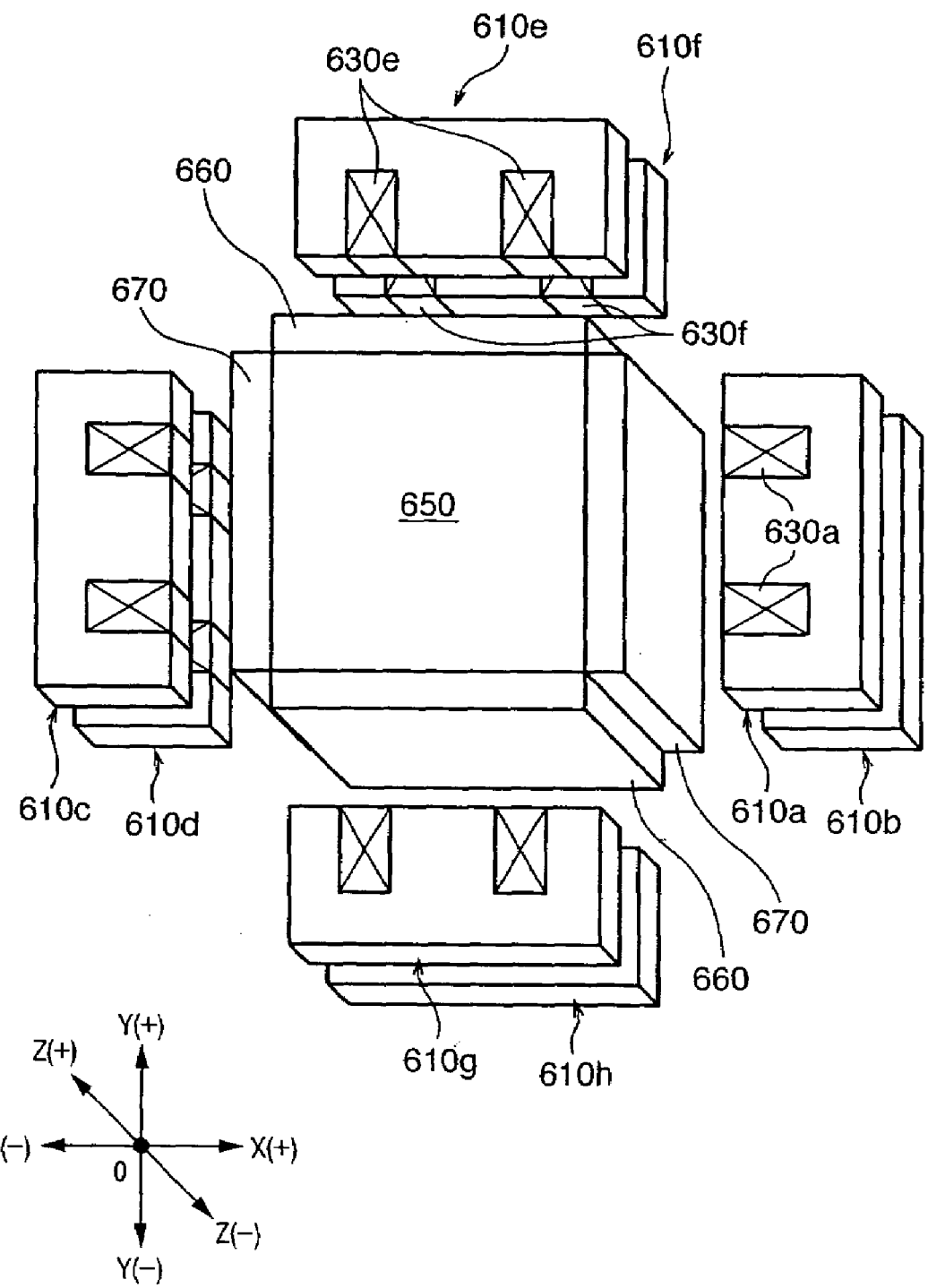
FIG. 6 is a diagram illustrating a construction of a two-axis driving mechanism having an electromagnet unit as a driving source.

A construction of a two-axis electromagnet stage according to the third embodiment is now described with reference to FIG. 6.

I cores 660 and 670 are integrally provided to an I core supporting member 650. Electromagnets 610a to 610d are arranged in a way to sandwich the I core 670. The electromagnets 610a to 610d generate predetermined suction power to translationally drive the I core 670 in the X(+/−) direction.

For instance, in order to translationally drive the I core 670 in the X(+) direction, a predetermined current is applied to excitation coils 630a and excitation coils of the electromagnet 610b, thereby causing suction power in the electromagnets 610a and 610b which are arranged on the X(+) side. To translationally drive the I core 670 in the X(−) direction, a current is applied to cause suction power in the electromagnets 610c and 610d.

Electromagnets 610e to 610h are arranged in a way to sandwich the I core 660. The electromagnets 610e to 610h generate predetermined suction power to translationally drive the I core 660 in the Y(+/−) direction.

For instance, in order to translationally drive the I core 660 in the Y(+) direction, a predetermined current is applied to excitation coils 630e and 630f, thereby causing suction power in the electromagnets 610e and 610f which are arranged on the Y(+) side. Similarly, to translationally drive the I core in the Y(−) direction, a current is applied to cause suction power in the electromagnets 610g and 610h.

The suction power generated by the electromagnets is realized by a similar mechanism to that of the first embodiment described with reference to FIGS. 3A to 3C, so a detailed description thereof is omitted. Leakage flux, which is formed when respective electromagnet units generate suction power, can be cancelled by the combination of electromagnets arranged in parallel (overlapped in the Z direction), i.e., 610a and 610b, 610c and 610d, 610e and 610f, 610g and 610h. Accordingly, by employing the electromagnet units utilizing the effect of magnetic field cancellation as a driving propulsion source of a two-axis direction, it is possible to construct a two-axis electromagnet stage which can reduce the leakage flux around the electromagnets.

Fourth Embodiment (Construction of Six-Degree-of-Freedom Stage)

A construction of a six-axis electromagnet stage according to the fourth embodiment is now described with reference to FIGS. 7 to 10. The six-axis electromagnet stage according to the fourth embodiment has a configuration suitable to a precision-motion substrate stage in a charged-particle-beam exposure apparatus, which mounts a substrate (wafer) and controls the position and posture of the substrate stage for positioning the substrate at a predetermined position and posture.

Figure 7A:
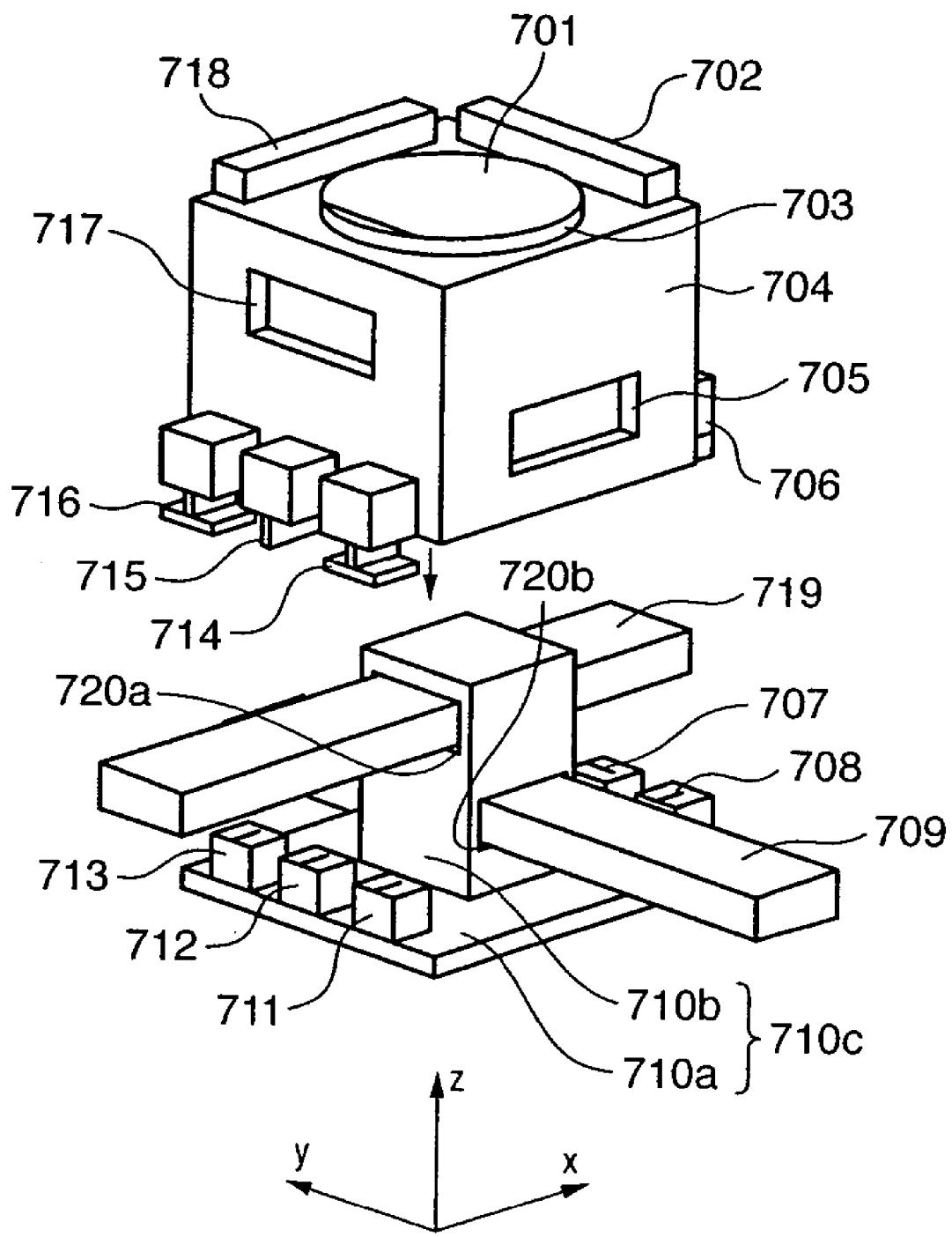
FIG. 7A is a diagram illustrating a construction of a six-axis driving mechanism having an electromagnet unit as a driving source.

FIG. 7A shows a construction of a precision-motion substrate stage. The precision-motion substrate stage is a six-degree-of-freedom stage capable of moving in an optical axis (Z axis) direction, a translational (X and Y axes) direction, a rotational direction around the Z axis (qz), and a rotational direction (tilt direction) around the X axis and Y axis (qx, qy). A wafer 701 is mounted on a substrate holder 703. As a driving source for moving the stage in the respective directions of the degrees of freedom, the above-described electromagnet units are provided for six degrees of freedom. The bottom plate 710a and side plate 710b, mounting the six-degree-of-freedom stage mechanism, functions as a precision-motion XY stage capable of moving in the X and Y directions, which are orthogonal to the optical axis (Z axis). The combination of the bottom plate 710a and side plate 710b will be referred to as a center slider 710c hereinafter.

Figure 8:
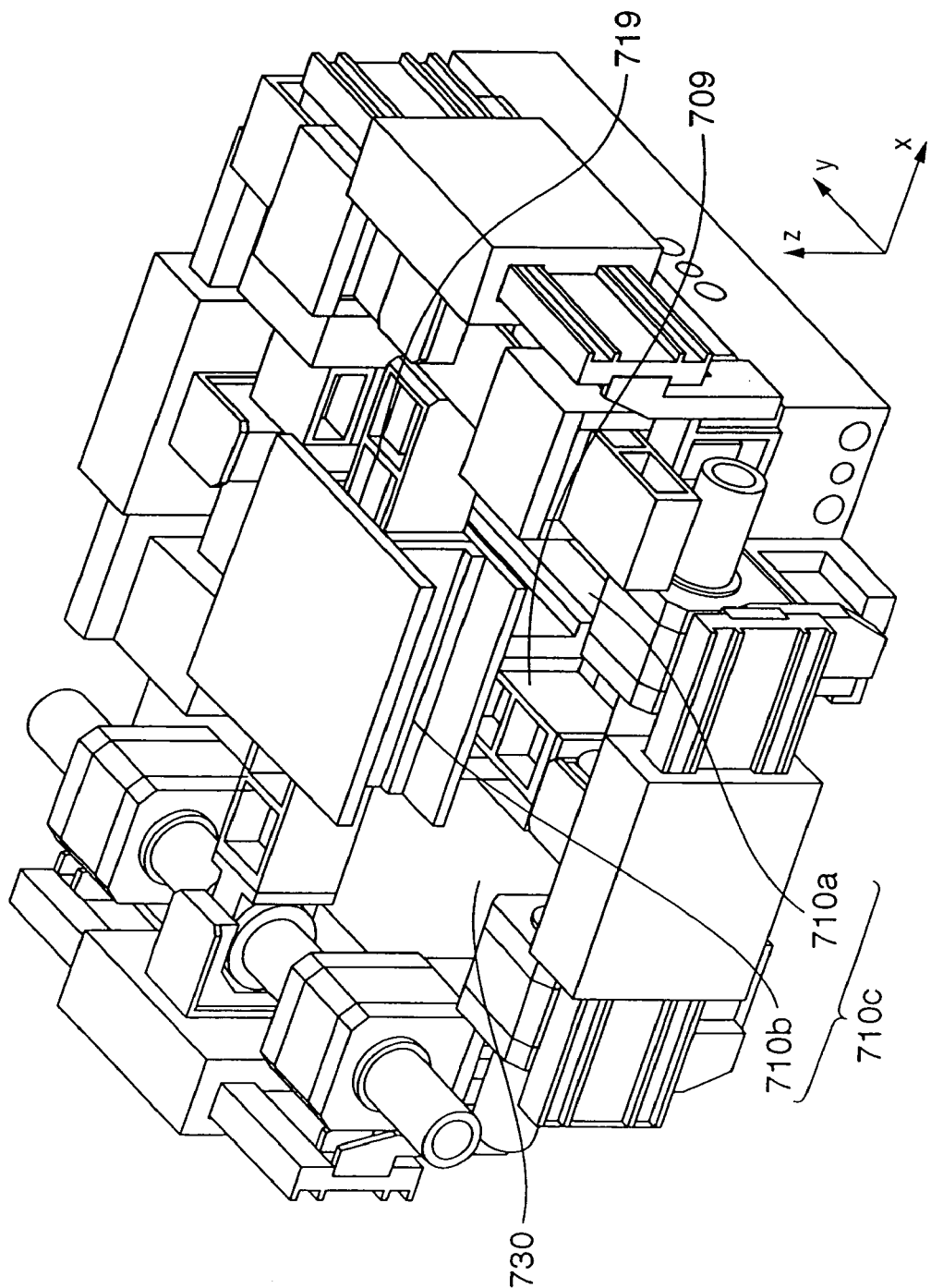
FIG. 8 is a diagram showing the overall construction of a precision-motion substrate stage incorporated in an XY carriage stage.

Assume that the center slider 710c is structured on an xy conveyance stage, which is capable of driving on the XY surface at high speed for performing positioning. The wafer is roughly positioned at high speed by the xy conveyance stage, and then precisely positioned by the precision-motion substrate stage according to this embodiment. FIG. 8 shows how the above-described precision-motion substrate stage is mounted on the stage base 730 and incorporated in the xy conveyance stage.

Figure 7B:
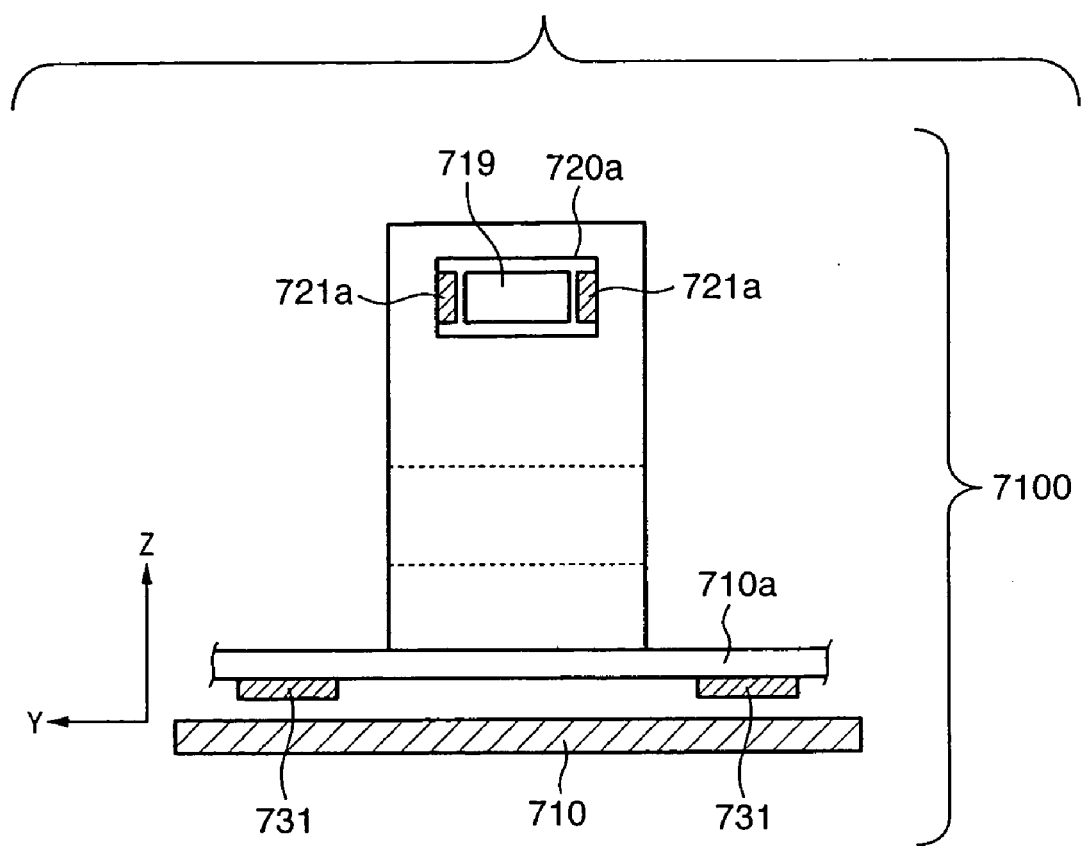
FIG. 7B is an explanatory view describing a configuration of a side plate constituting a center slider.
Figure 7B:
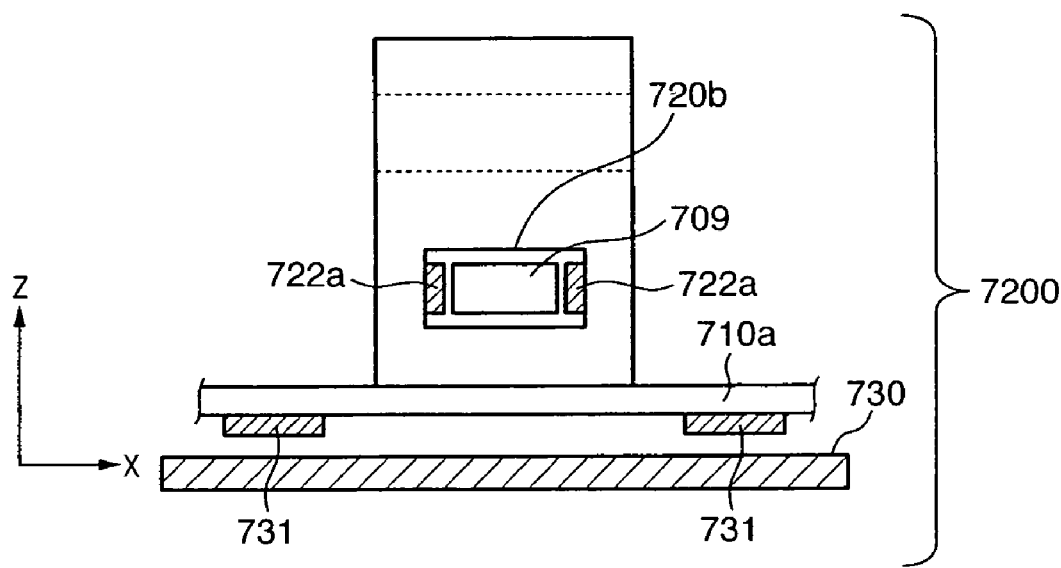

Referring to FIG. 7B, numeral 7100 shows a schematic view of the side plate 710b seen from the yz plane. A Y movable guide 719 is slidably supported by virtue of bearings 721a, provided in the internal portion of an opening 720a.

Similarly, numeral 7200 shows a schematic view of the side plate 710b seen from the xz plane. An X movable guide 709 is slidably supported by virtue of bearings 722a, provided in the internal portion of an opening 720b.

To move the center slider 710c in the x direction, thrust in the x direction is added to the X movable guide 709 to slide the Y movable guide 719 in the opening 720a, thereby guiding the driving of the center slider 710c in the x direction. To move the center slider 710c in the y direction, thrust in the y direction is added to the Y movable guide 719 to slide the X movable guide 709 in the opening 720b, thereby guiding the driving of the center slider 710c in the y direction. Bearings 731 are provided on the bottom surface of the bottom plate 710a, which faces the top surface of the stage base 730 supporting the entire precision-motion substrate stage 704. When the center slider 710c is driven in the x and y directions, the sliding motion of the slider is guided along the top surface of the stage base 730.

On the top surface of the precision-motion substrate stage 704, a substrate holder 703 for holding a conveyance target, e.g., a wafer, and X reflection mirror 702 and Y reflection mirror 718 for measuring the position of the stages are mounted. Using the reflection mirrors, for instance, a laser interferometer held in a sample chamber (not shown) can measure the position of the substrate stage in the x and y directions using the internal wall of the chamber as a reference.

Using the same reflection mirrors, the position of the stage is also measured with respect to the rotational direction around the Z axis (θz) and the rotational direction (tilt direction) around the X axis and Y axis (θx, θy). It is preferable that the measurement of the rotational direction and tilt direction be performed from a direction orthogonal to lines of plural beams. With respect to the z direction, an optical sensor using nonphotosensitive light performs the detection. A vacuum-compliant encoder may be used as a servo sensor.

The precision-motion substrate stage 704 has a cage-like structure to surround the center slider 710c. Opening portions 705 and 717 are provided so that the X movable guide 709 and Y movable guide 719 combine to penetrate the opening portions.

Six movable members (706, 714 to 716) are fixed to the precision-motion substrate stage 704. In correspondence with the respective movable members, driving units (707, 708, 711 to 713) having the electromagnet units (FIG. 2A) are fixed to the bottom plate 710a.

Figure 7C:
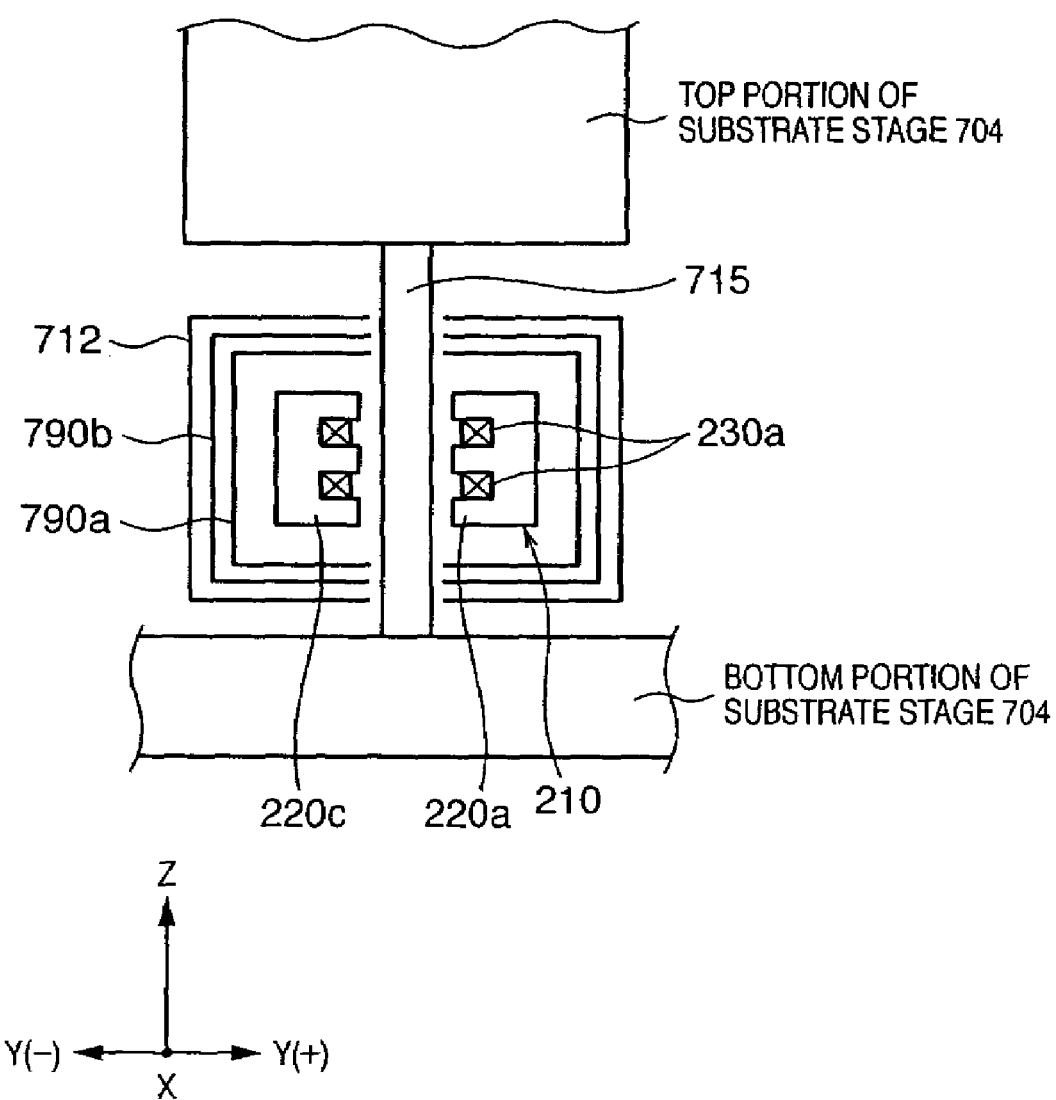
FIG. 7C is an explanatory view describing a relation between a driving unit and a movable member.

FIG. 7C shows a state in which the Y1 driving unit 712 and Y1 movable member 715 shown in FIG. 7A are combined. The excitation coil 230a is wound around the E core 220a and the excitation coil 230c is wound around the E core 220c, thus constituting the electromagnet 210. Applying a current of a predetermined polarity can generate suction power that pulls the Y1 movable member 715 in the Y-axis direction. In the electromagnet unit, multiple magnetic shields 790a and 790b are provided. The magnetic shields have opening portions so that the movable members (715) can be inserted. The Y1 driving unit 712 is fixed to the bottom plate 710a.

Figure 9A:
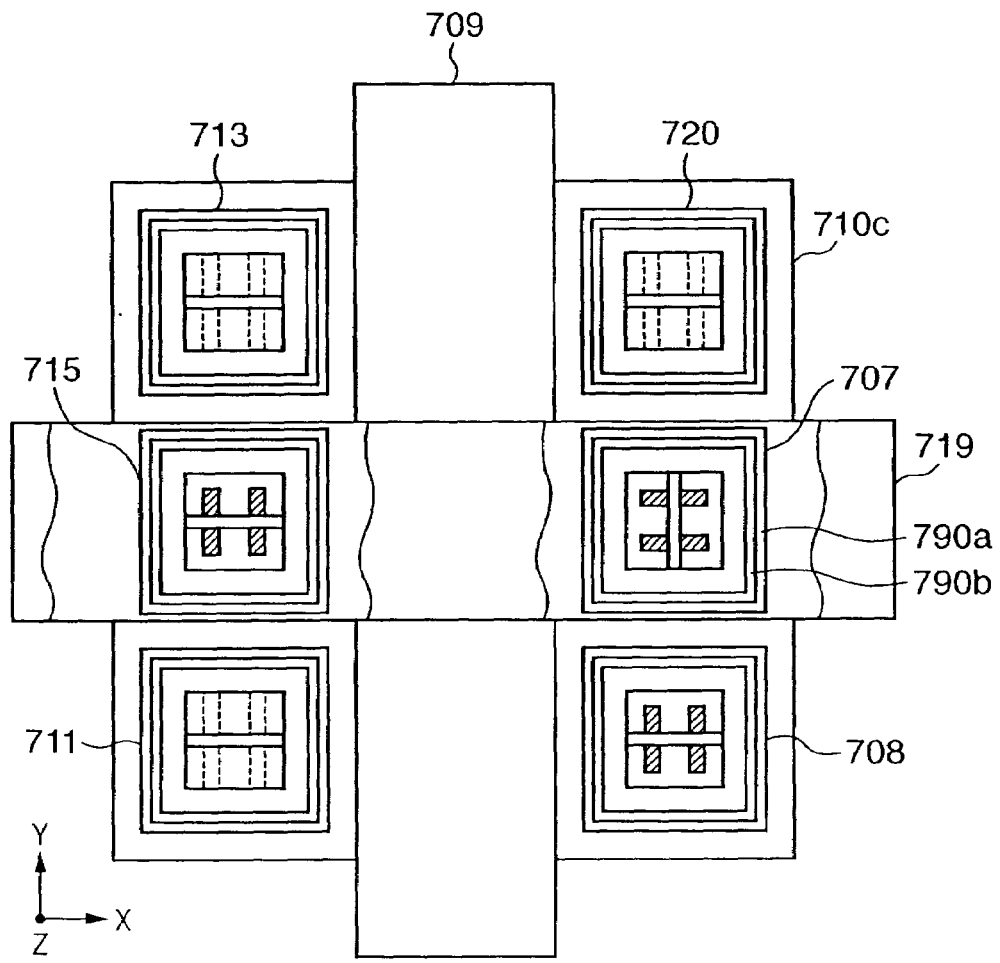
FIGS. 9A and 9B are diagrams showing an example of arrangement of the driving units.
Figure 9B:
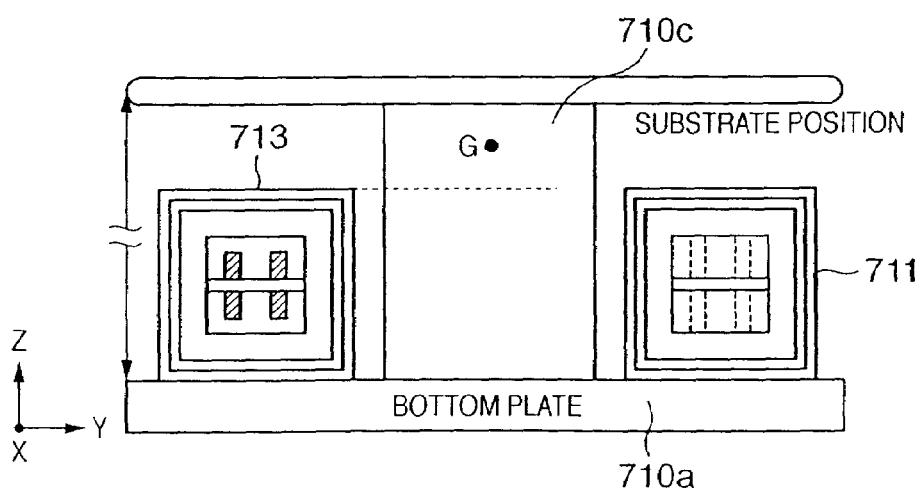

FIG. 9A shows an arrangement of stationary members (hatched portions) included in the electromagnet units of the respective driving-axis directions. The stationary members are arranged in respective positions: three pairs of stationary members for the Z1 electromagnet unit 713, Z2 electromagnet unit 711, and Z3 electromagnet unit 720 which generate driving force in the z direction; stationary members for the X1 electromagnet unit 707 which generates driving force in the x direction; and two pairs of stationary members for the Y1 electromagnet unit 712 and Y2 electromagnet unit 708 which generate driving force in the y direction. According to the configuration of this embodiment, the precision-motion substrate stage 703 can be driven in the six-degree-of-freedom directions by virtue of the combination of driving force in plural directions generated by the plural driving units (707, 708, 711 to 713, 720). The arrangement of the respective driving units is not limited to the one shown in FIG. 9A. Other arrangements may be adopted as long as the translational driving in the X, Y and Z directions and the rotational driving around the X, Y and Z axes are achieved by combinations of driving force generated by respective electromagnet unit stationary members.

Multiple magnetic shields (790a, 790b in FIG. 7C) formed with Permalloy or the like are provided to the six driving units (707, 708, 711 to 713, 720) so as not to cause fluctuation in the magnetic field. It is also preferable that the driving units be arranged sufficiently far from the demagnifying electron-optical system and the substrate position (FIG. 9B) so that leakage flux from the demagnifying electron-optical system does not cause fluctuation in the magnetic field. More specifically, it is preferable that the driving units (707, 708, 711 to 713, 720) be arranged in a way that a distance (h) from the substrate position to the center of gravity G of the center slider 710c is equal to a distance (h) from the driving unit to the center of gravity G with respect to the z direction.

(Description of Driving Unit)

The driving unit is configured with the electromagnet unit comprising the I core 200 serving as a movable member, four E cores 220 (220a to 220d) serving as a stationary member, and eight excitation coils, as described in FIG. 2A.

The I core serving as a movable member of the driving unit is fixed to the precision-motion substrate stage 704 side. Each driving unit is fixed to the center slider 710c so as not to make relative movement. By applying a current of a predetermined polarity to each excitation coil, the two E cores (220a, 220b in the case of FIG. 2A) arranged in parallel (overlapped in the Z direction) are excited. As a result, a magnetic path is formed from the E cores (220a, 220b) to the I core 200 (movable members 714 to 716 in the case of FIG. 7A) through the gap, thus generating magnetic suction power between the E cores and I core. Accordingly, the movable member (I core) can be pulled from the left or the right (or from the top or the bottom). In other words, the movable member (I core) can be driven in the plus or minus direction with respect to one axis. By simultaneously applying currents of inverse directions having the same amount to the excitation coils of the respective E cores, the direction of suction power generated can be controlled to a certain direction.

As mentioned in the foregoing embodiment, combinations of electromagnets can cancel the leakage flux in the space around the electromagnets. This effect will be described in detail with reference to FIGS. 10A and 10B.

(Leakage Flux Cancellation Effect)

Figure 10A:
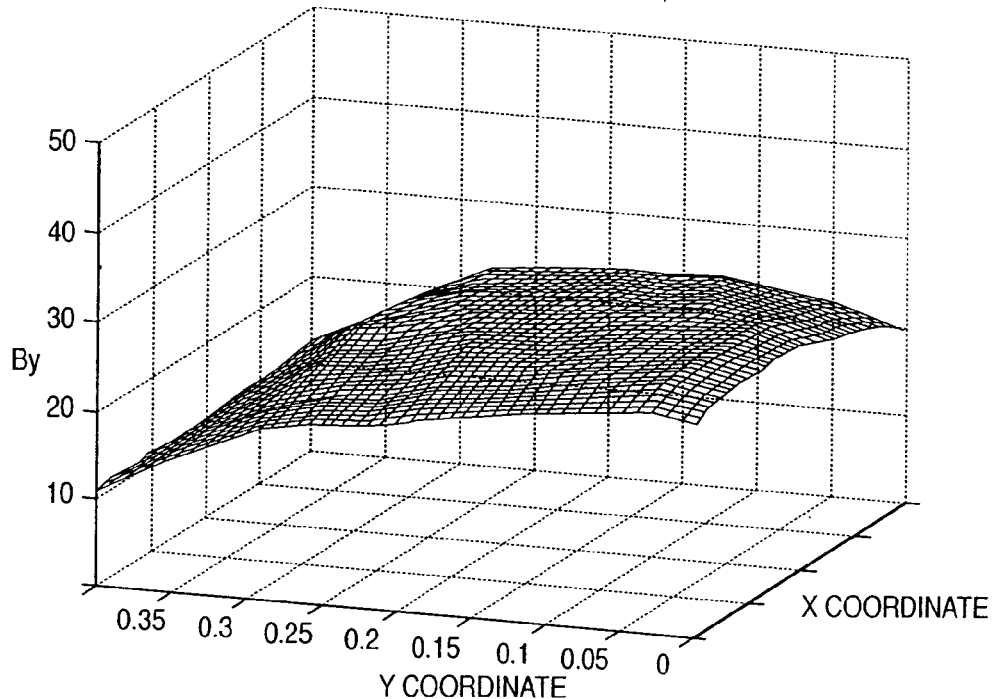
FIGS. 10A and 10B are coordinate systems showing a calculation result of leakage flux distribution.
Figure 10B:
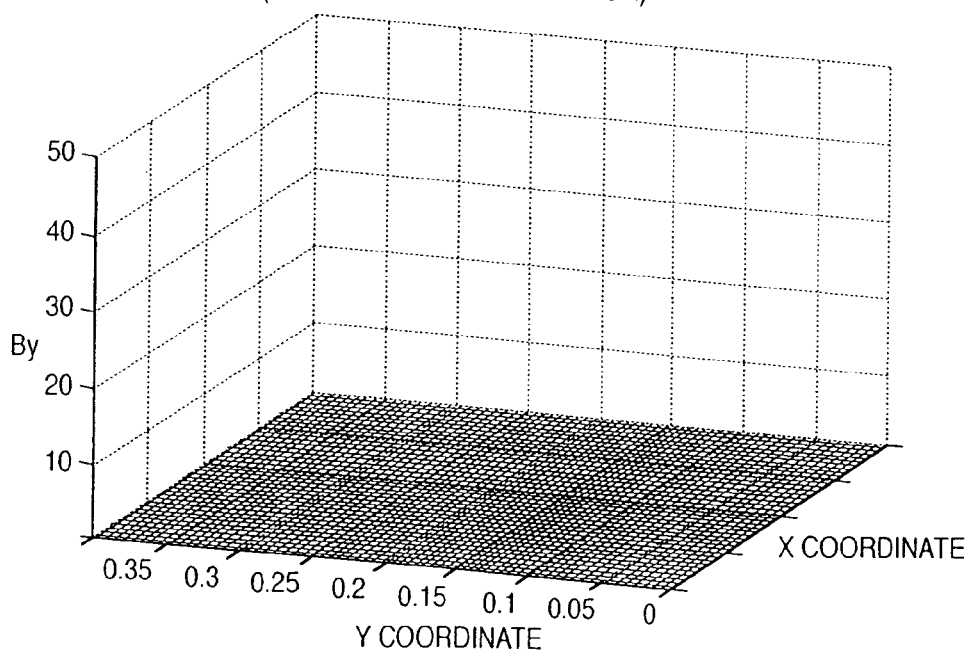

FIG. 10A shows a calculation result of leakage flux distribution in the neighborhood of the substrate when the respective electromagnet units are excited. FIG. 10A shows a case where currents of a uniform direction are applied respectively to the two electromagnets arranged in parallel (overlapped in the z direction). FIG. 10B shows a case where currents of inverse directions are applied respectively to the two electromagnets arranged in parallel. FIGS. 10A and 10B show that the absolute value of the magnetic field in the neighborhood of the substrate can be reduced to at least $\frac{1}{10}$ or less.

(Positional Relation of Cores)

The predetermined gap provided between the end surface of the E core and the end surface of the I core is actually 2 or 3 mm or less. It is preferable that the gap be set much smaller than the distance between the two electromagnets arranged in parallel (overlapped in the z direction). The positional relation between the E cores (220a and 220b, 220c and 220d) and the positional relation between the E cores and I core are set as already described above with reference to FIG. 3C. Taking the magnetic path between the E cores 220a and 220b of the electromagnets 210a and 210b, and the magnetic path of the E cores (220a, 220B) and the I core 200 for an example, the magnetic flux generated in the magnetic path of the E cores (220a, 220b) and the I core 200 becomes dominant according to the foregoing positional relation. Therefore, the influence of the magnetic path between the E cores 220a and 220b becomes extremely small.

The structure of the movable members according to the present embodiment is not limited to the integrated one. For instance, plural movable members for the plus and minus directions may be provided to the movable-member supporting member as shown in FIG. 4. In this case, the supporting member integrally supporting the movable members may be formed with a magnetic material or a nonmagnetic material.

In order to generate predetermined suction power in the driving unit, it is necessary to simultaneously apply currents of inverse directions having the same amount to, e.g., the excitation coils 230a and 230b of the electromagnets 210a and 210b arranged in the overlapping direction. The excitation coils 230a and 230b may be wound around the E cores 220a and 220b in the directions opposite to each other. Alternatively, the coils may be wound around the E cores in the same direction, but the polarity of the electric currents applied to the excitation coils may be inverted by controlling of the current control circuit 700.

Fifth Embodiment

A one-axis electromagnet stage according to the fifth embodiment is described with reference to FIGS. 11A and 11B.

Figure 11A:
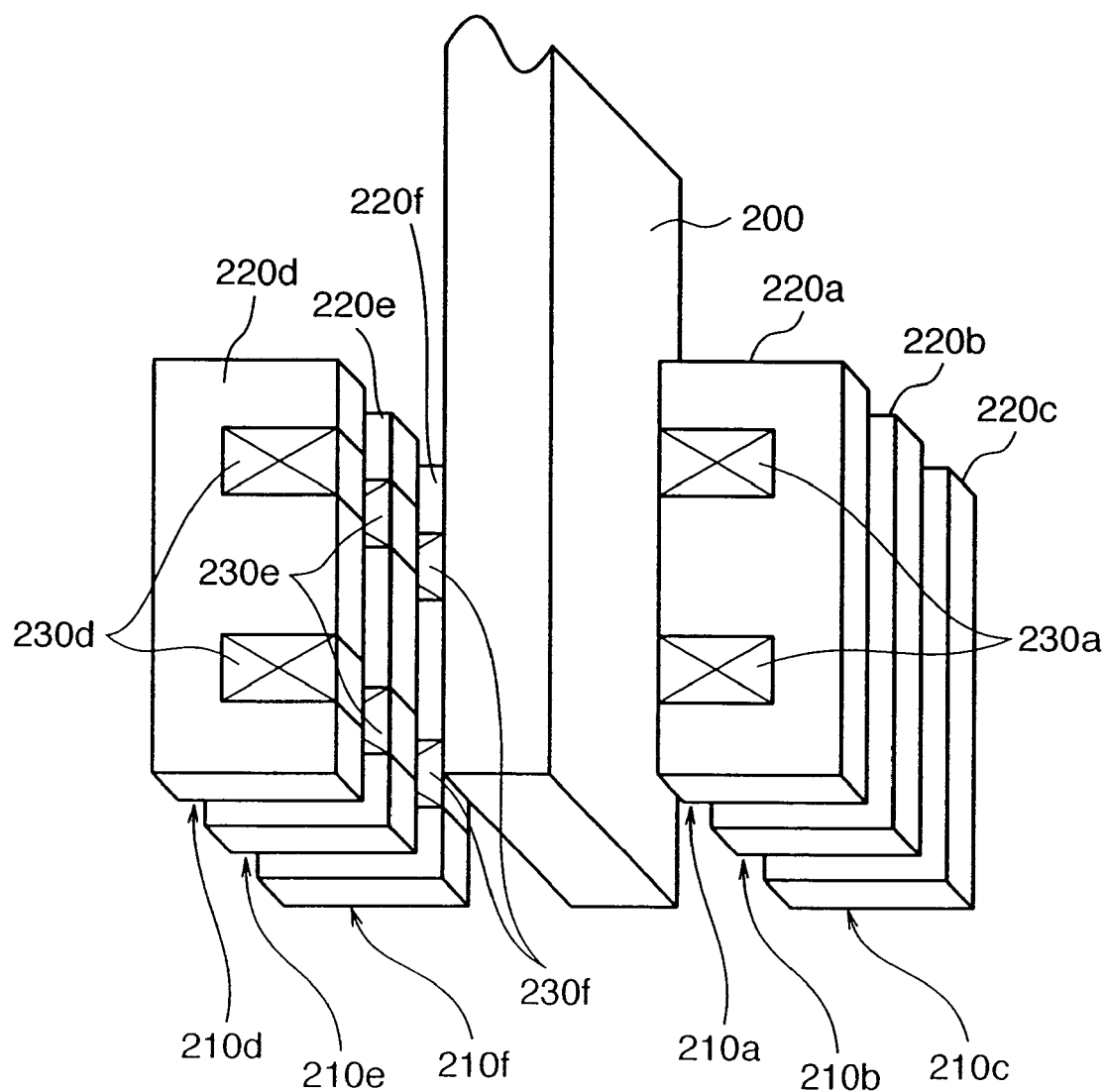
FIG. 11A is a diagram illustrating a construction of a one-axis driving mechanism having an electromagnet unit as a driving source.
Figure 11B:
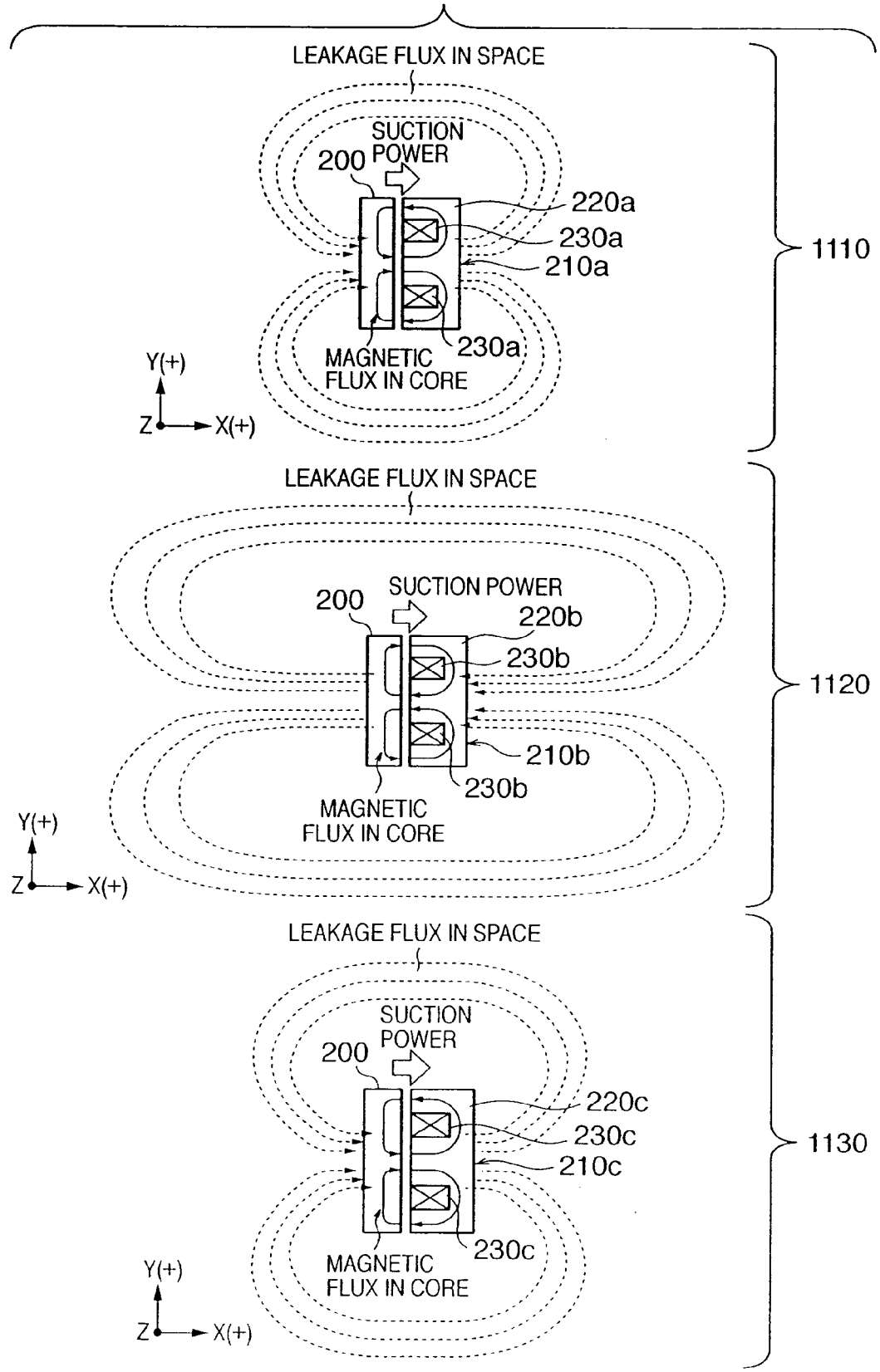
FIG. 11B is an explanatory view of a magnetic flux distribution of electromagnets.

The one-axis driving mechanism, shown in FIG. 11A, employing electromagnets as a driving source, is configured with an I core 200, which is a movable member, and electromagnets 210a to 210f Three of the electromagnets (210a, 210b, 210c and 210d, 210e, 210f) are arranged in each side of the I core in a way to sandwich the I core while maintaining a predetermined gap. The six electromagnets are constructed with six E cores 220a to 220f and excitation coils 230a to 230f, which are wound around the E cores. For instance, the excitation coil 230a is wound around the E core 220a, and the excitation coil 230d is wound around the E core 220d, as shown in FIG. 11A. The six E cores 220a to 220f and excitation coils 230a to 230f are arranged as a stationary member, and are integrally connected so as not to make relative movement.

To drive the I core 200 serving as a movable member in the X(+) direction, currents of a predetermined polarity are simultaneously applied to the excitation coils 230a, 230b and 230c of the electromagnets 210a, 210b and 210c arranged on the X(+) side, thereby exciting the electromagnets. As a result, magnetic flux is generated in a magnetic path from the E cores (220*a*, 220*b*, 220*c*) to the I core 200 through the gap, and suction power is generated between the E cores (220*a*, 220*b*, 220*c*) and the I core 200 due to the magnetic action.

By virtue of the suction power, the I core 200 can be moved in the X(+) direction. Taking the aforementioned leakage flux cancellation effect into consideration, currents are applied to the excitation coils so that the magnetic flux formed in the respective magnetic path has an identical direction for the two electromagnets (210*a* and 210*c* in FIG. 11A) positioned in both ends of the three electromagnets arranged in the overlapping direction (Z direction), and has an inverse direction for the electromagnet 210*b* positioned in the center of the three electromagnets (see 1110 to 1130 in FIG. 11B). In this case, the magnetic flux generated by the respective electromagnets is controlled in accordance with the winding direction of the excitation coils, the polarity of the current controlled by the current control circuit shown in FIG. 2B, and the amount of current (ampere turn).

The three electromagnets on one side of the I core respectively form magnetic paths from the E cores (220*a*, 220*b*, 220*c*) to the I core 200 through the gap. Among the three electromagnets, only the electromagnet 210*b* positioned in the center has an opposite current direction. Therefore, the magnetic flux flowing through the magnetic path of the electromagnet 210*b* has an inverse direction (1120 in FIG. 11B). Accordingly, the distribution of magnetic field leaking in the space around the electromagnet 210*b* has an opposite direction to that of the electromagnets 210*a* and 210*c*. Since the intensity of the magnetic field is proportional to the amount of current, the intensity of the magnetic field of the magnetic flux formed around the electromagnet 210*b* needs to be twice as high as that of the magnetic flux formed around the electromagnets 210*a* and 210*c*.

In other words, assuming that the amount of current (ampere turn) applied by the current control circuit 700 to the electromagnets (210*a*, 210*c*) positioned on both ends is one, the amount of current applied to the electromagnet 210*b* is two. Therefore, the amount of current is controlled so that currents are applied simultaneously to the three electromagnets arranged in parallel (overlapped in the Z direction) at a ratio of 1:2:1 and an inverse current is applied only to the electromagnet positioned in the center.

Since the excited electromagnets 210*a*, 210*b* and 210*c* are arranged in parallel (overlapping direction) and provided (away from each other) in the same direction, the magnetic flux distributed in the space around the respective electromagnets overlaps one another. The magnetic flux from the electromagnets 210*a* and 210*c* positioned on both ends and the magnetic flux from the electromagnet 210*b* positioned in the center cancel each other, thereby enabling reduction of the overall leakage flux around the three electromagnets. By virtue of the magnetic flux cancellation effect, it is possible to achieve a one-axis electromagnet stage having little leakage flux.

In the fifth embodiment, applying currents of a predetermined polarity to the excitation coils 230*a*, 230*b* and 230*c* can be realized by winding the excitation coils 230*a*, 230*b* and 230*c* around the E cores in the directions opposite to one another. Alternatively, the coils may be wound around the E cores in the same direction, but the polarity of the electric currents applied to the excitation coils may be inverted by controlling of the current control circuit 700 (FIG. 2A).

The structure of the movable members according to the present embodiment is not limited to the integrated one. For instance, plural movable members for the plus and minus directions may be provided to the movable-member supporting member as shown in FIG. 4. In this case, the supporting member integrally supporting the movable members may be formed with a magnetic material or a nonmagnetic material. The E cores 220 and I core 200 are formed with a magnetic material, such as a multi-layer steel plate.

Adopting a nonmagnetic material as the supporting member enables reduction in weight of the entire movable members, thus achieving an advantageous construction for high acceleration/deceleration of the stage and high-speed positioning.

Sixth Embodiment (Charged-Particle-Beam Exposure Apparatus)

Figure 12:
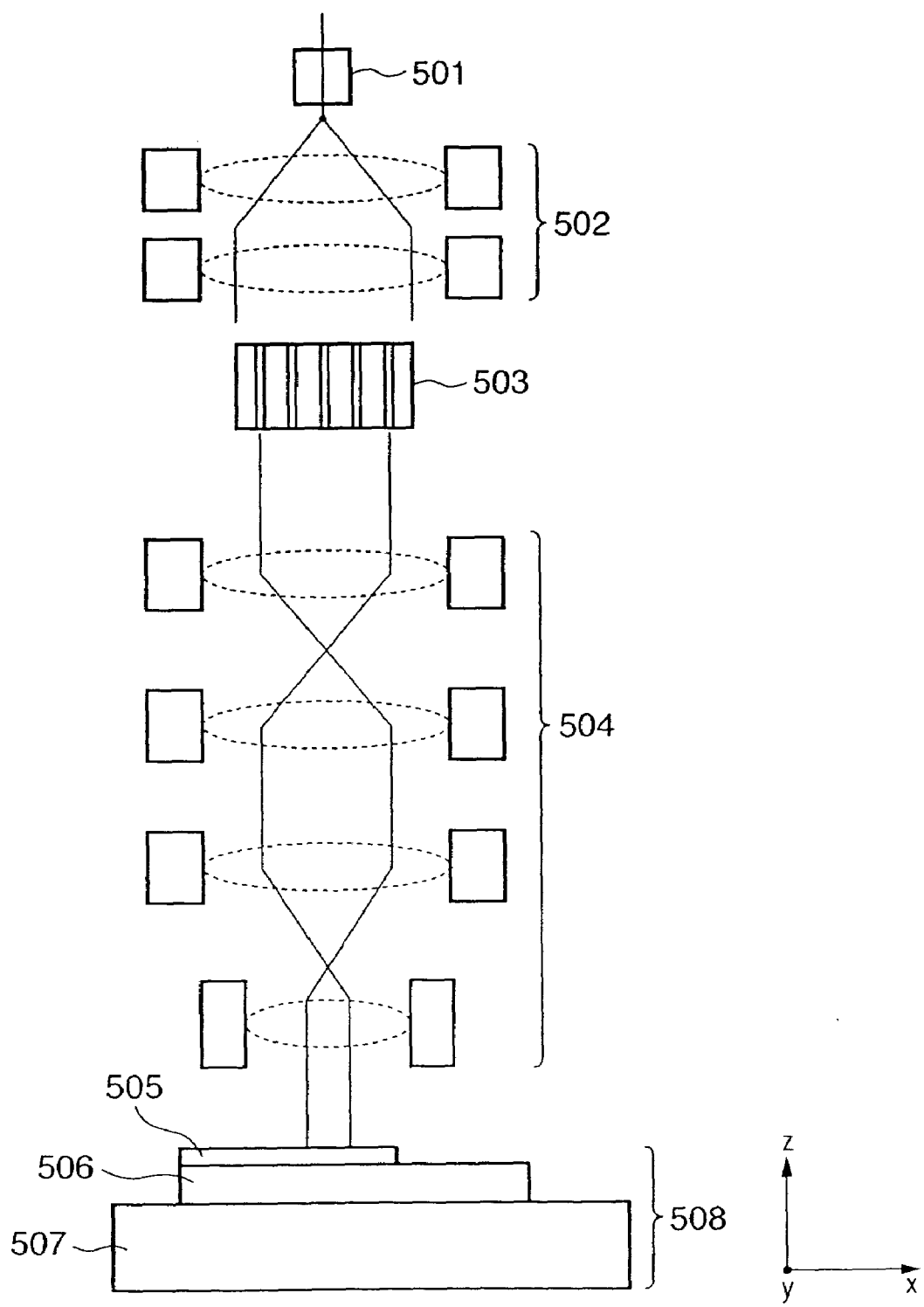
FIG. 12 is a schematic view showing a construction of a charged-particle-beam exposure apparatus.

Described next is a charged-particle-beam exposure apparatus incorporating a positioning apparatus employing the electromagnets described in the first to fifth embodiments as a driving source. FIG. 12 is a schematic view showing a construction of a charged-particle-beam exposure apparatus. In FIG. 12, numeral 501 denotes an electron gun, which serves as a charged particle source, and includes the cathode, grid, and anode (not shown). An electron source ES irradiated by the electron gun is emitted to an electron optical system 503 through an illumination electron optical system 502. The electron optical system 503 is configured with an aperture array, a blanker array, an element electron optical array unit, or the like, which are not shown. The electron optical system 503 forms a plurality of electron source (ES) images. Demagnifying projection is performed on the images by a projection electron optical system 504, thereby forming electron source ES images on a wafer 505 serving as an exposure target surface. A positioning apparatus 508, on which the wafer 505 is placed, is configured with a positioning mechanism 507 and a precision motion mechanism 506. The positioning mechanism 507 performs positioning on the plane by moving in the XY direction. The precision motion mechanism 506 performs more precise positioning with respect to the position determined by the positioning mechanism 507, and adjusts the rotational direction of each axis.

Figure 13:
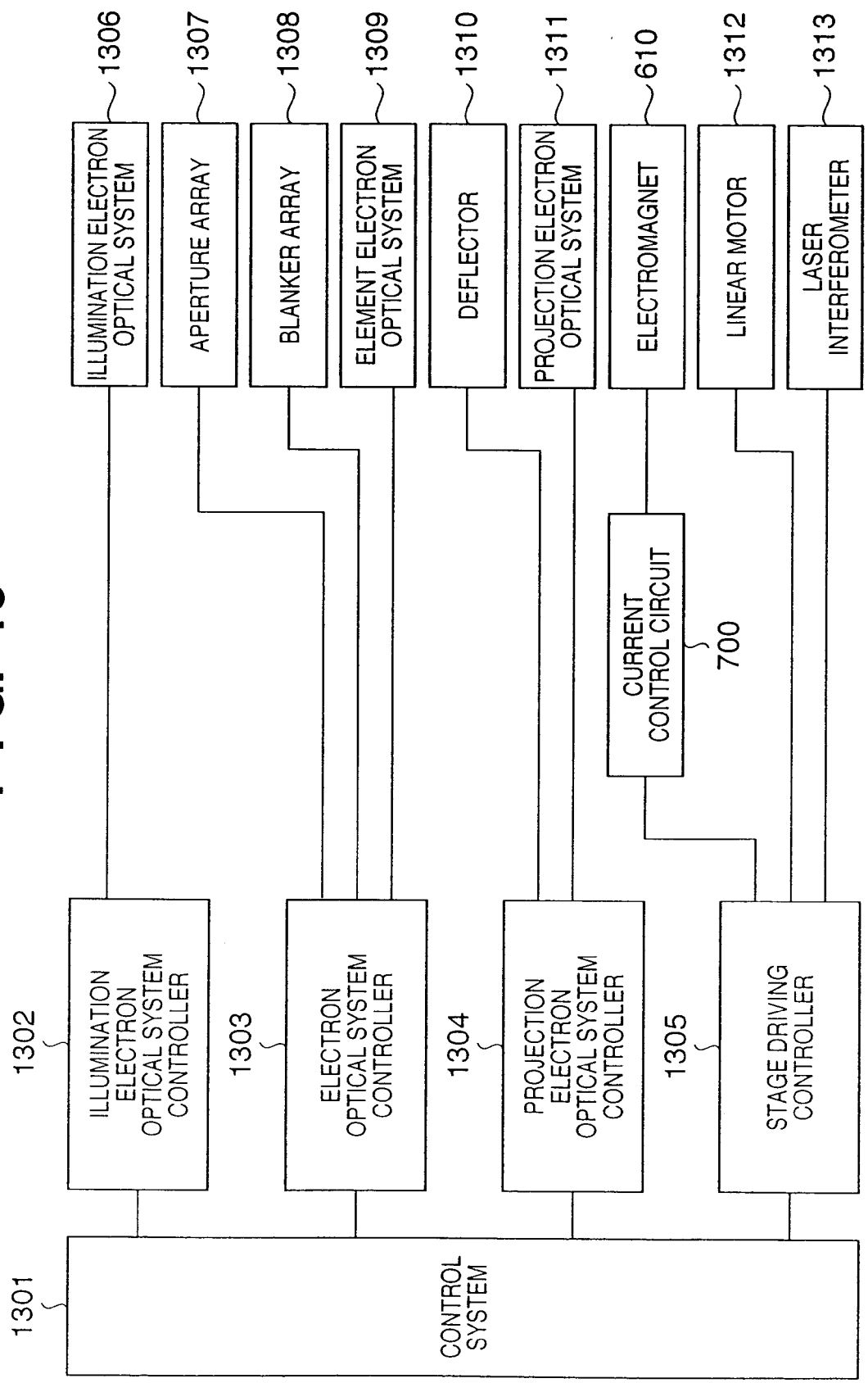
FIG. 13 is a block diagram showing a control structure of a charged-particle-beam exposure apparatus.

For the positioning apparatus 508, the positioning apparatus described in the aforementioned embodiments is employed. FIG. 13 is a block diagram showing a control structure of the charged-particle-beam exposure apparatus.

A control system 1301 controls optical system controllers (1302 to 1304) and a stage driving controller 1305 which controls positioning of the stages. The illumination electron optical system controller 1302 controls an illumination electron optical system 1306 based on exposure control data. The electron optical system controller 1303 controls an aperture array 1307, a blanker array 1308, and an element electron optical system 1309. The projection electron optical system controller 1304 controls a deflector 1310 and a projection electron optical system 1311.

The stage driving controller 1305 governs the overall position measurement and driving commands for driving the positioning mechanism, and controls the respective electromagnets that drive the precision-motion substrate stage 704 (FIG. 7A) through the current control circuit 700.

Also, the stage driving controller 1305 drives the linear motor 1312 to control positioning of the XY conveyance stage on the plane of the stage base 730.

In controlling the linear motor 1312 and electromagnets 610, the stage driving controller 1305 detects the stage position data by a laser interferometer 1313 and feeds back the position data to the control loop, thereby driving each actuator (610, 1312) and positioning the wafer 701 to a target exposure position corresponding to the exposure control data.

As described above, according to the charged-particle-beam exposure apparatus incorporating the positioning apparatus employing the electromagnets described in the above-described embodiments as a driving source, it is possible to realize highly precise positioning of a wafer.

Application to a Semiconductor Manufacturing Process

A semiconductor device manufacturing process (e.g., semiconductor chips, such as an IC or an LSI, CCDs, liquid crystal panels, and the like) employing the above-described charged-particle-beam exposure apparatus is described with reference to FIG. 14.

Figure 14:
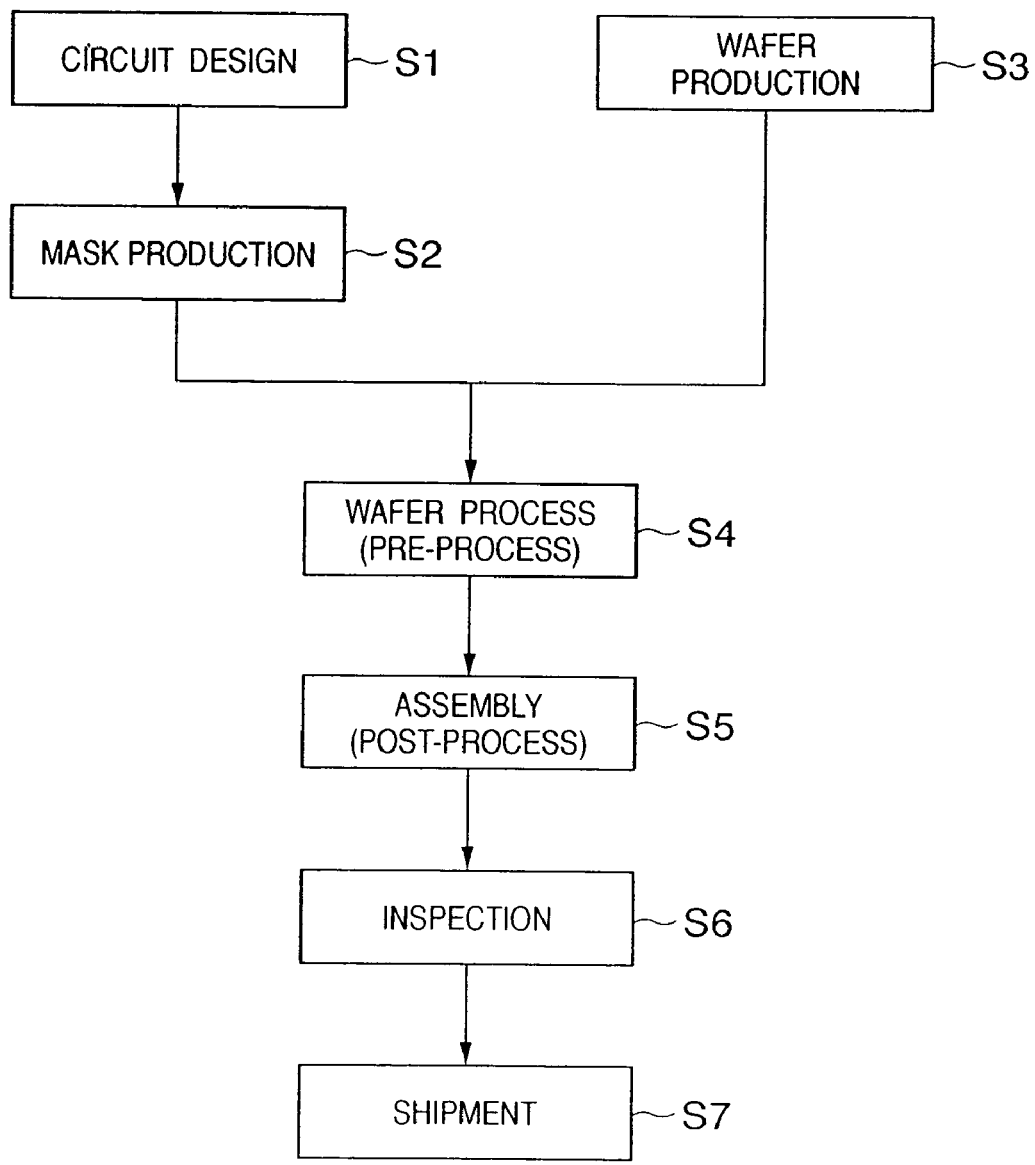
FIG. 14 is a block diagram showing overall steps of a semiconductor device manufacturing process.

FIG. 14 shows a flow of an overall semiconductor device manufacturing process. In step 1 (circuit design), a circuit of a semiconductor device is designed. In step 2, exposure control data of the exposure apparatus is generated based on the designed circuit pattern. Meanwhile, in step 3 (wafer production), a wafer is produced with a material such as silicon. In step 4 (wafer process), which is called a pre-process, an actual circuit is formed on the wafer using the mask and wafer by a lithography technique. In step 5 (assembly), which is called a post-process, a semiconductor chip is manufactured using the wafer produced in step 4. Step 5 includes an assembling process (dicing, bonding), a packaging process (chip embedding), and so on. In step 6 (inspection), the semiconductor device manufactured in step 5 is subjected to inspection such as an operation-check test a durability test, and so on. The semiconductor device, manufactured in the foregoing processes, is shipped (step 7).

The aforementioned wafer process in step 4 includes the following steps: an oxidization step for oxidizing the wafer surface, a CVD step for depositing an insulating film on the wafer surface, an electrode forming step for depositing electrodes on the wafer, an ion implantation step for implanting ions on the wafer, a resist-process step for coating a photosensitive agent on the wafer, an exposure step for exposing the circuit pattern on the wafer by the above-described exposure apparatus, a developing step for developing the exposed wafer, an etching step for removing portions other than the developed resist image, and a resist separation step for removing the unnecessary resist after the etching process. By repeating the foregoing steps, multiple circuit patterns are formed on the wafer.

By employing the above-described charged-particle-beam exposure apparatus, it is possible to achieve high precision in exposure operation and improved throughput of the apparatus. Therefore, the productivity of semiconductor devices can be improved more than by using conventional productivity techniques.

As has been described above, according to the present invention, leakage flux can be canceled between a plurality of electromagnets by arranging the electromagnets in the overlapping direction. As a result, it is possible to reduce magnetic field fluctuation in the neighborhood of the electromagnets.

Furthermore, by virtue of the simplified structure, magnetic field fluctuation can be reduced. Therefore, it is possible to reduce weight of the precision-motion substrate stage, and realize high acceleration/deceleration of the stage which mounts the precision-motion substrate stage, as well as high-speed positioning.

As many apparently widely different embodiments of the present invention can be made without departing from the spirit and scope thereof, it is to be understood that the invention is not limited to the specific embodiments thereof except as defined in the claims.

What is claimed is:

1. A positioning apparatus comprising:
    a movable member;
    a first pair of electromagnets configured to sandwich said movable member and each to generate suction power having an inverse direction between said movable member and each electromagnet of said first pair of electromagnets;
    a second pair of electromagnets configured to sandwich said movable member and each to generate suction power having an inverse direction between said movable member and each electromagnet of said second pair of electromagnets; and
    a third pair of electromagnets configured to sandwich said movable member and each to generate suction power having an inverse direction between said movable member and each electromagnet of said third pair of electromagnets,
    wherein said first and second pair of electromagnets are controlled to generate a driving force in a same direction in order to drive said movable member,
    said first pair of electromagnets is controlled to reduce generation of a leakage flux from said second pair of electromagnets, and
    said third pair of electromagnets are controlled to cancel generation of a leakage flux from said first pair of electromagnets and said second pair of electromagnets.

2. A positioning apparatus according to claim 1, wherein each of said first pair of electromagnets and said second pair of electromagnets are controlled to generate a magnetic flux having an inverted polarity with respect to the other.

3. A positioning apparatus according to claim 1, wherein said movable member includes an iron core.

4. A positioning apparatus according to claim 1, wherein said movable member includes a core configured with a magnetic material, which forms magnetic paths respectively between said first and second pairs of electromagnets and the core.

5. A positioning apparatus according to claim 1, wherein currents of inverse directions having substantially a same amount are applied to said first and second pair of electromagnets.

6. A positioning apparatus according to claim 1, wherein said first pair of electromagnets and said second pair of electromagnets comprise a coil and a core, wherein the coil is wound around the core.

7. A positioning apparatus according to claim 1, further comprising a stage configured to be fixed with said movable member and to mount an object to be positioned, wherein said stage is driven in X-axis, Y-axis and Z-axis directions, and a rotational direction around respective axes.

* * * * *

UNITED STATES PATENT AND TRADEMARK OFFICE
CERTIFICATE OF CORRECTION

PATENT NO. : 7,193,339 B2
APPLICATION NO. : 10/693104
DATED : March 20, 2007
INVENTOR(S) : Shinji Uchida Page 1 of 1

It is certified that error appears in the above-identified patent and that said Letters Patent is hereby corrected as shown below:

COLUMN 3:
Line 51, "riot" should read -- not --.

COLUMN 5:
Line 41, "50 that" should read -- so that --.

COLUMN 7:
Line 43, "axis (qz)," should read -- axis (θz), --.
Line 45, "axis (qz, qy)." should read -- axis (θx, θy). --.

COLUMN 10:
Line 51, "210f" should read -- 210f. --

COLUMN 11:
Line 49, "flux" should read -- fluxes --.
Line 50, "overlaps" should read -- overlap --.

Signed and Sealed this

Twenty-seventh Day of November, 2007

JON W. DUDAS
*Director of the United States Patent and Trademark Office*